United States Patent
Sugihara et al.

(10) Patent No.: US 8,198,886 B2
(45) Date of Patent: Jun. 12, 2012

(54) MAGNETIC DETECTING DEVICE AND METHOD FOR MANUFACTURING THE SAME

(75) Inventors: Shinji Sugihara, Tokyo (JP); Hideto Ando, Tokyo (JP); Shinichi Sasaki, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 865 days.

(21) Appl. No.: 12/256,798

(22) Filed: Oct. 23, 2008

(65) Prior Publication Data
US 2009/0045810 A1    Feb. 19, 2009

(30) Foreign Application Priority Data
Feb. 2, 2007 (JP) .................................. 2007-023853

(51) Int. Cl.
*G01R 1/20* (2006.01)
(52) U.S. Cl. ........................................ 324/126; 324/127
(58) Field of Classification Search .................. 324/252, 324/207.21
See application file for complete search history.

(56) References Cited

U.S. PATENT DOCUMENTS
7,005,958 B2 * 2/2006 Wan ............................ 338/32 R
7,777,607 B2 * 8/2010 Taylor et al. ................ 338/32 R
* cited by examiner

*Primary Examiner* — Huy Q Phan
*Assistant Examiner* — Temilade S Rhodes-Vivour
(74) *Attorney, Agent, or Firm* — Brinks Hofer Gilson & Lione

(57) ABSTRACT

A magnetic detecting device includes a first and a second magnetoresistive element, and a first and a second fixed resistor connected in series to the first and the second magnetoresistive element, respectively. The first and the second magnetoresistive element each include a pinned magnetic layer and a free magnetic layer with a nonmagnetic conductive layer in between. The first and the second magnetoresistive element have the same layer structure except that the nonmagnetic conductive layers have different thicknesses. The thicknesses of the nonmagnetic conductive layers are set so that a positive interlayer coupling magnetic field acts between the free magnetic layer and the pinned magnetic layer of the first magnetoresistive element and a negative interlayer coupling magnetic field acts between the free magnetic layer and the pinned magnetic layer of the second magnetoresistive element. The first and the second fixed resistor have the same layer structure.

11 Claims, 13 Drawing Sheets

MAGNETIC DETECTING DEVICE AND METHOD FOR MANUFACTURING THE SAME

CLAIM OF PRIORITY

This application claims benefit of the Japanese Patent Application No. 2007-023853 filed on Feb. 2, 2007, which is hereby incorporated by reference.

BACKGROUND OF THE INVENTION

1. Field of the Invention

The present invention relates to a magnetic detecting device including a first and a second magnetoresistive element having opposite interlayer coupling magnetic fields +Hin and −Hin and to a method for manufacturing the same, and particularly to a magnetic detecting device whose magnetoresistive elements have a small difference in temperature coefficient of resistance (TCR) and are connected in series to respective fixed resistors formed in the same process.

2. Description of the Related Art

Giant magnetoresistive elements (GMR elements) using the magnetoresistive effect are used in magnetic sensors (magnetic detecting devices).

For example, a magnetic sensor disclosed in Japanese Unexamined Patent Application Publication No. 2006-253562 (FIG. 12) includes four resistors constituting a bridge circuit. Two of the four resistors are magnetoresistive elements, and the other two are fixed resistors having constant electric resistances independent of the external magnetic field.

When an external magnetic field oriented in a direction is defined as a (+)-direction external magnetic field and an external magnetic field oriented in the opposite direction to the (+) direction is defined as a (−)-direction external magnetic field, the magnetic sensor can be of bidirectional type configured to detect both the (+)-direction external magnetic field and the (−)-direction external magnetic field. In this instance, the magnetic sensor is configured so that a first interlayer coupling magnetic field Hin 1 acting between the pinned magnetic layer and the free magnetic layer of one magnetoresistive element (hereinafter referred to as first magnetoresistive element) can be positive, and so that a second interlayer coupling magnetic field Hin 2 acting between the pinned magnetic layer and the free magnetic layer of the other magnetoresistive element (hereinafter referred to as second magnetoresistive element) can be negative. Thus, the resistance of the first magnetoresistive element can be varied by the (+)-direction external magnetic field and the resistance of the second magnetoresistive element can be varied by the (−)-direction external magnetic field.

Thus, a bidirectional magnetic sensor can be achieved by using two magnetoresistive elements having opposite interlayer coupling magnetic fields +Hin and −Hin.

Japanese Unexamined Patent Application Publication Nos. 2006-266777 and 2006-208255 also disclose such magnetic sensors.

In order to give opposite interlayer coupling magnetic fields +Hin and −Hin to the first and second magnetoresistive elements, the antiferromagnetic layers of the magnetoresistive elements may have different thicknesses from each other, or the magnetoresistive elements may be formed of different materials or have different multilayer structures.

However, those modifications of the magnetoresistive elements increase the difference in TRC between the first and the second magnetoresistive element.

In order to adjust the TCRs of the fixed resistor (first fixed resistor) connected to the first magnetoresistive element in series and the fixed resistor (second fixed resistor) connected to the second magnetoresistive element to the TCRs of the respective magnetoresistive elements, the first and second fixed resistors must be formed of different materials or in different layer structures in different process steps.

Accordingly, in the known manufacturing process, the first magnetoresistive element, the second magnetoresistive element, the first fixed resistor, and the second fixed resistor must be formed in different process steps. The known manufacturing process is thus complicated.

In addition, if the magnetoresistive element and the fixed resistor connected to the magnetoresistive element in series have different TCRs, the midpoint potential may be varied with temperature and, in the worst case, may result in impossibility of switching operation.

SUMMARY OF THE INVENTION

Accordingly, the present invention provides a magnetic detecting device including a first and a second magnetoresistive element having opposite interlayer coupling magnetic fields and a method for manufacturing the same. In particular, the magnetoresistive elements have small difference in TCRs and the fixed resistors connected to the respective magnetoresistive elements in series are formed in the same process step.

According to an aspect of the invention, a magnetic detecting device is provided which includes a first and a second magnetoresistive element using the magnetoresistive effect that changes their electric resistances depending on an external magnetic field, a first fixed resistor connected to the first magnetoresistive element in series, and a second fixed resistor connected to the second magnetoresistive element in series. The first and the second magnetoresistive element each include a pinned magnetic layer, a free magnetic layer, and a nonmagnetic conductive layer between the pinned magnetic layer and the free magnetic layer, thus acting as a giant magnetoresistive element whose electric resistance changes depending on the relationship between the magnetizations of the pinned magnetic layer and the free magnetic layer. The first and the second magnetoresistive element have the same layer structure as each other except that the nonmagnetic conductive layers have different thicknesses from each other. In the device, a first interlayer coupling magnetic field acts between the free magnetic layer and the pinned magnetic layer of the first magnetoresistive element and a second interlayer coupling magnetic field acts between the free magnetic layer and the pinned magnetic layer of the second magnetoresistive element. The thicknesses of the nonmagnetic conductive layers of the first and the second magnetoresistive element are set so that the first interlayer coupling magnetic field becomes positive and the second interlayer coupling magnetic field becomes negative. The first and the second fixed resistor have the same layer structure as each other, and have an electric resistance independent of the external magnetic field.

The same layer structure mentioned herein means that two elements include the same material layers and that the corresponding layers made of the same material of the two elements have the same thickness.

The first and the second magnetoresistive element have the same layer structure except that the nonmagnetic conductive layers have different thicknesses. Consequently, the TCRs of the first and second magnetoresistive elements can be set to substantially the same value.

The changes in thickness of the nonmagnetic conductive layer do not affect the TCR much. Also, the magnitude of the interlayer coupling magnetic field Hin can be appropriately changed by varying the thickness of the nonmagnetic conductive layer. In the embodiment of the invention, by forming the nonmagnetic conductive layers of the first and the second magnetoresistive element to different thicknesses from each other, the first and the second magnetoresistive element can be given opposite interlayer coupling magnetic fields Hin 1 and Hin 2 to each other while the first and the second magnetoresistive element have a small difference in TCR.

The first and the second fixed resistor have the same layer structure as each other. Consequently, the first fixed resistor and the second fixed resistor have the same TCR, and besides each fixed resistor has substantially the same TCR as the corresponding magnetoresistive element connected in series even though the first and the second fixed resistor have the same layer structure, because the first and the second magnetoresistive element have substantially the same TCR.

Since the first and the second fixed resistor have the same layer structure, they can be formed in the same process step.

Preferably, the nonmagnetic conductive layers are made of Cu. Thus, the difference in TCR between the first and the second magnetoresistive element can be reduced, and the first and the second magnetoresistive element can be given opposite interlayer coupling magnetic fields Hin 1 and Hin 2 to each other.

Preferably, the nonmagnetic conductive layer of the first magnetoresistive element has a thickness in the range of 24 to 26.5 Å, and the nonmagnetic conductive layer of the second magnetoresistive element has a thickness in the range of 19.5 to 21 Å. Thus, the difference in TCR between the first and the second magnetoresistive element can be reduced effectively. Also, the interlayer coupling magnetic fields Hin 1 and Hin 2 of the first and the second magnetoresistive element can be set so as not to be affected much by the variation in thickness of the Cu layer, or the nonmagnetic conductive layer.

Preferably, the first and the second fixed resistor each include layers made of the same materials as the layers of the first and the second magnetoresistive element, including a magnetic layer corresponding to the free magnetic layers of the first and the second magnetoresistive element and a nonmagnetic conductive layer, and the magnetic layer and the nonmagnetic conductive layer in the first and the second fixed resistor are disposed in an inverse order to the order of the free magnetic layer and the nonmagnetic conductive layer in the first and the second magnetoresistive element. Consequently, the electric resistances of the first and the second fixed resistor are not affected by the external magnetic field. Also, the TCRs of the first and the second fixed resistor can be adjusted close to the TCRs of the first and the second magnetoresistive element. In addition, the electric resistances of the first and the second fixed resistor can be easily adjusted to the electric resistances of the first and the second magnetoresistive element.

Preferably, the layers of the first and the second fixed resistor except the nonmagnetic conductive layer each have the same thickness as the corresponding layer of the first and the second magnetoresistive element. Consequently, the TCR of the first and the second fixed resistor can be easily adjusted to substantially the same value as the TCRs of the first and the second magnetoresistive element.

Preferably, each nonmagnetic conductive layer is made of Cu, and the nonmagnetic conductive layer of the first magnetoresistive element has a thickness in the range of 24 to 26.5 Å, the nonmagnetic conductive layer of the second magnetoresistive element has a thickness in the range of 19.5 to 21 Å, and the nonmagnetic conductive layers of the first and the second fixed resistor have a thickness in the range of 19.5 to 26.5 Å.

According to another aspect of the invention, a method is provided for manufacturing a magnetic detecting device including a first and a second magnetoresistive element using the magnetoresistive effect that changes the electric resistances thereof depending on an external magnetic field, and a first and a second fixed resistor connected in series to the first magnetoresistive element and the second magnetoresistive element, respectively, and having an electric resistance independent of the external magnetic field. The method includes the steps of forming the first magnetoresistive element, forming the second magnetoresistive element, and forming the first and the second fixed resistor together in the same layer structure. The first magnetoresistive element is formed in a layer structure including a pinned magnetic layer, a free magnetic layer, and a nonmagnetic conductive layer between the pinned magnetic layer and the free magnetic layer, thus acting as a giant magnetoresistive element whose electric resistance changes depending on the relationship between the magnetization of the pinned magnetic layer and the free magnetic layer. The nonmagnetic conductive layer is formed to a thickness that can produce a positive first interlayer coupling magnetic field between the free magnetic layer and the pinned magnetic layer. The second magnetoresistive element is formed in the same layer structure as the first magnetoresistive element except that the nonmagnetic conductive layer is formed to a different thickness that can produce a negative second interlayer coupling magnetic field between the free magnetic layer and the pinned magnetic layer. The first and the second magnetoresistive element are formed in different steps.

In an embodiment of the invention, by forming the nonmagnetic conductive layers of the first and the second magnetoresistive element to different thicknesses from each other, opposite interlayer coupling magnetic fields Hin 1 and Hin 2 are given to the first and the second magnetoresistive element. Since the first and the second magnetoresistive element have the same layer structure except that the nonmagnetic conductive layers have different thicknesses, the first and the second magnetoresistive element can have substantially the same TCR.

In addition, the first and the second fixed resistor have the same layer structure as each other. Consequently, the first fixed resistor and the second fixed resistor have the same TCR, and besides each fixed resistor has substantially the same TCR as the corresponding magnetoresistive element connected in series even though the first and the second fixed resistor are formed in the same layer structure, because the first and the second magnetoresistive element have substantially the same TCR.

The embodiment of the invention allows the first and the second fixed resistor to be formed in the same process step, thus more simplifying the manufacturing process of the magnetic detecting device than the known manufacturing process.

Preferably, the nonmagnetic conductive layers are formed of Cu. In this instance, preferably, the nonmagnetic conductive layer of the first magnetoresistive element is formed to a thickness in the range of 24 to 26.5 Å, and the nonmagnetic conductive layer of the second magnetoresistive element is formed to a thickness in the range of 19.5 to 21 Å. Thus, the difference in TCR between the first and the second magnetoresistive element can be reduced effectively. Also, the interlayer coupling magnetic fields Hin 1 and Hin 2 of the first and the second magnetoresistive element can be set so as not to be affected much by the variation in thickness of the Cu layer, or the nonmagnetic conductive layer.

Preferably, the first and the second fixed resistor are formed so as to include layers formed of the same materials as the layers of the first and the second magnetoresistive element, including a magnetic layer corresponding to the free magnetic layers of the first and the second magnetoresistive element and a nonmagnetic conductive layer, and the magnetic layer and the nonmagnetic conductive layer in the first and the second fixed resistor are formed in an inverse order to the order of the free magnetic layer and the nonmagnetic conductive layer in the first and the second magnetoresistive element. Since the first and the second fixed resistor can be formed of the same materials as the first and the second magnetoresistive element, the manufacturing process of the first and the second fixed resistors can be simplified.

Preferably, each nonmagnetic conductive layer is formed of Cu, and the nonmagnetic conductive layer of the first magnetoresistive element is formed to a thickness in the range of 24 to 26.5 Å, the nonmagnetic conductive layer of the second magnetoresistive element is formed to a thickness in the range of 19.5 to 21 Å, and the nonmagnetic conductive layers of the first and the second fixed resistor are formed to a thickness in the range of 19.5 to 26.5 Å.

DESCRIPTION OF THE PREFERRED EMBODIMENTS

Figure 1:
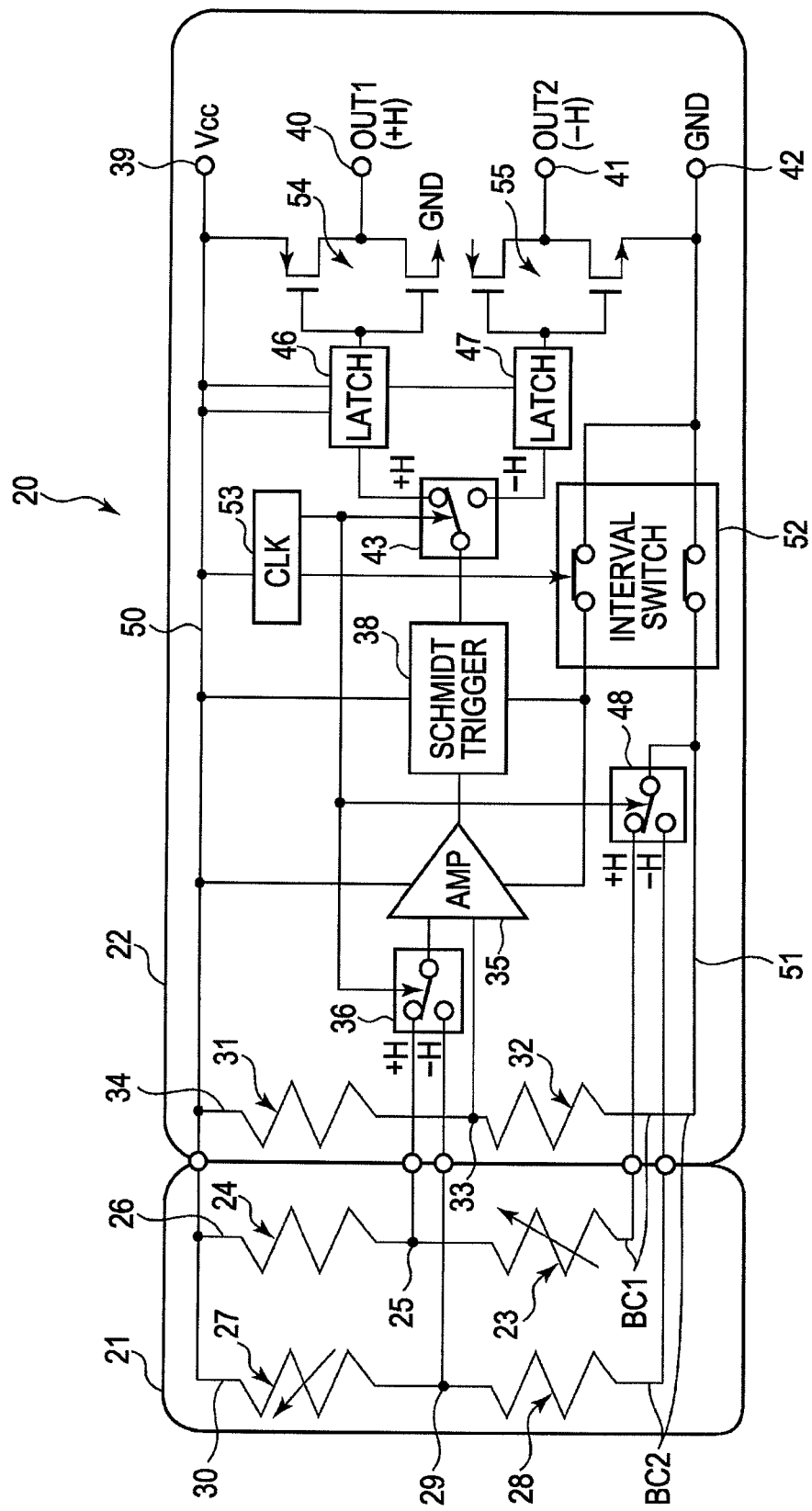
FIG. 1 is a circuit diagram of a magnetic detecting device according to an embodiment of the invention in a state in which a (+)-direction external magnetic field is detected.
Figure 2:
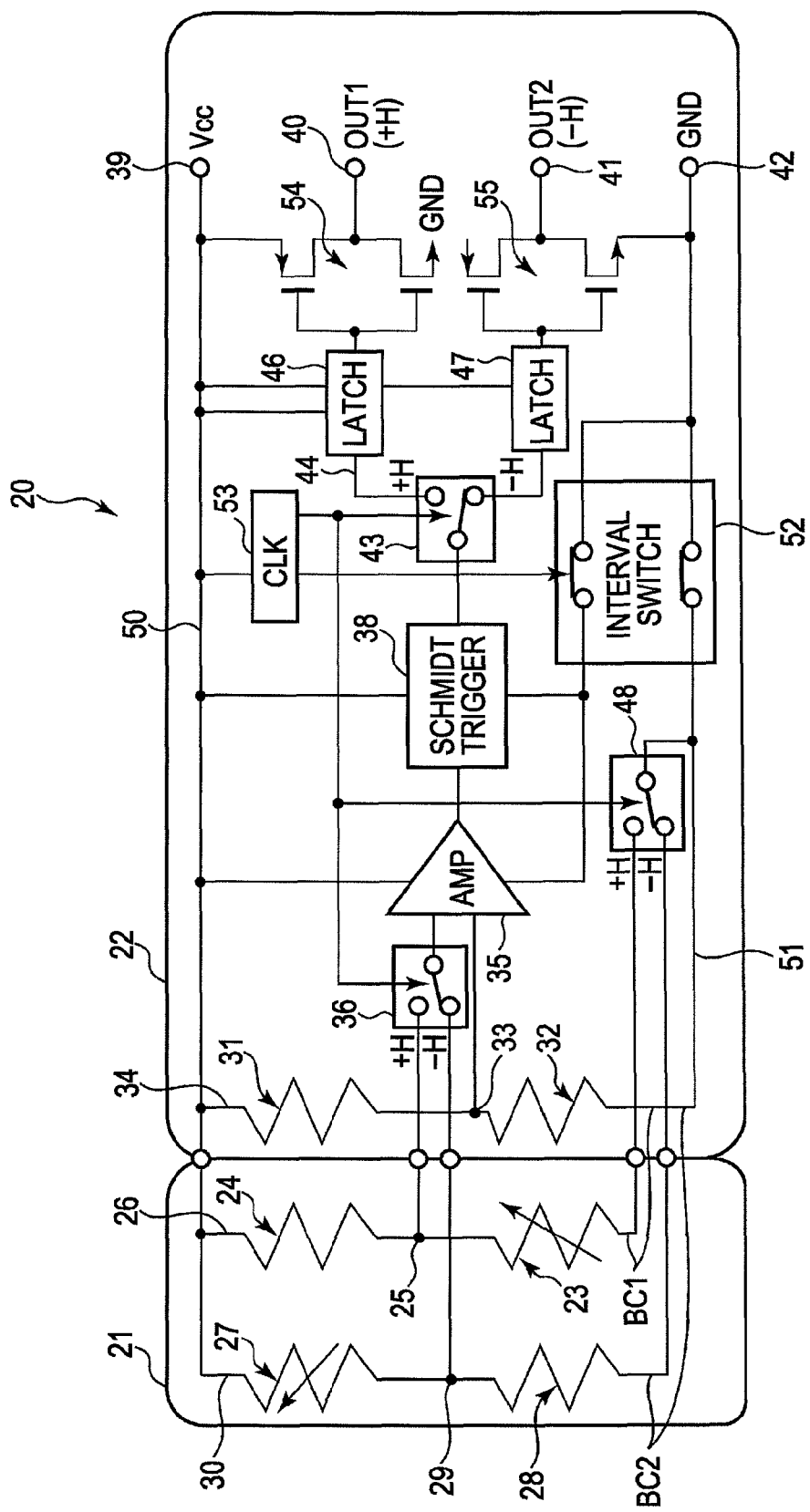
FIG. 2 is a circuit diagram of the magnetic detecting device in a state in which a (−)-direction external magnetic field is detected.
Figure 3:
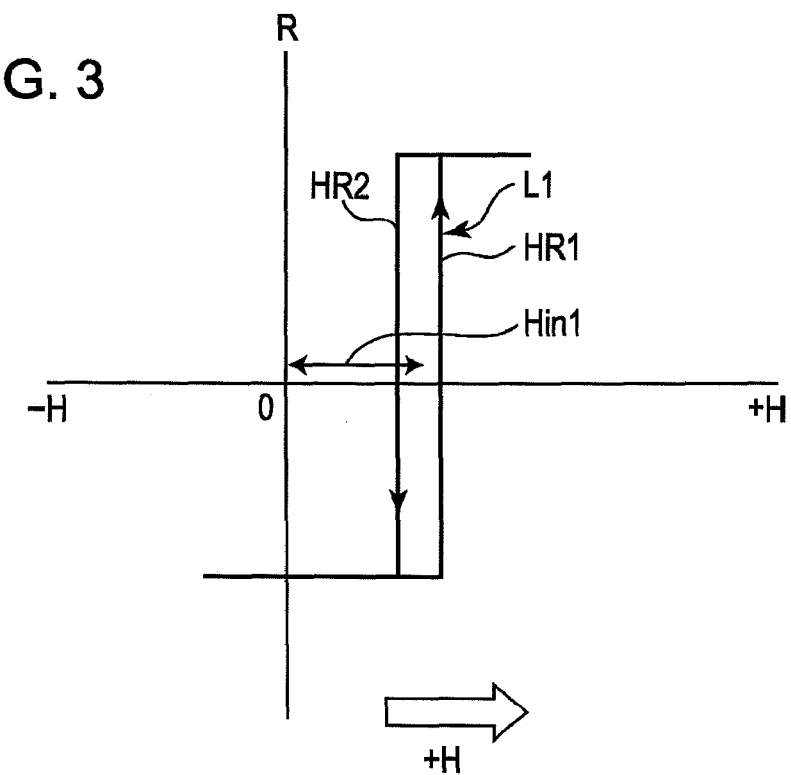
FIG. 3 is an R-H curve of the first magnetoresistive element of the magnetic detecting device.
Figure 4:
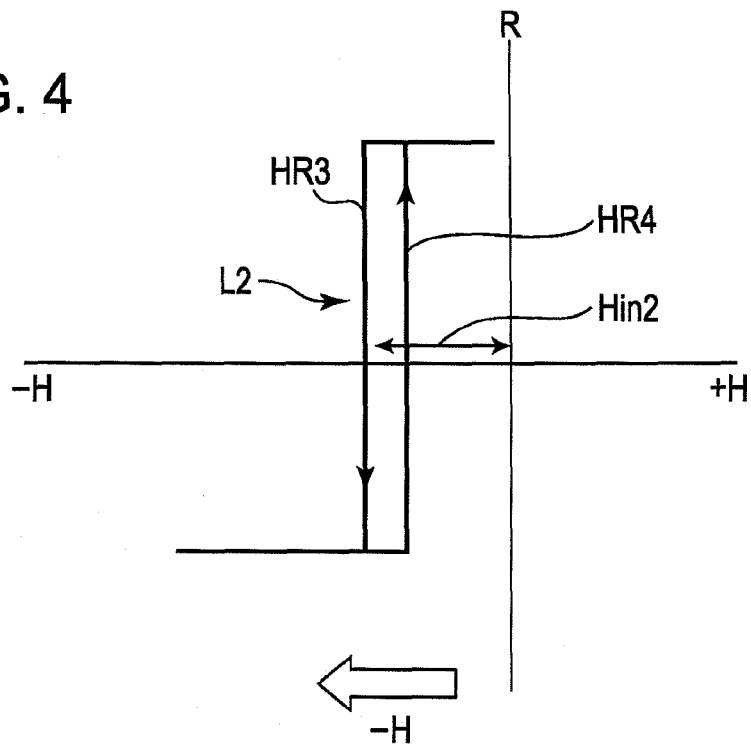
FIG. 4 is an R-H curve of the second magnetoresistive element of the magnetic detecting device.
Figure 5:
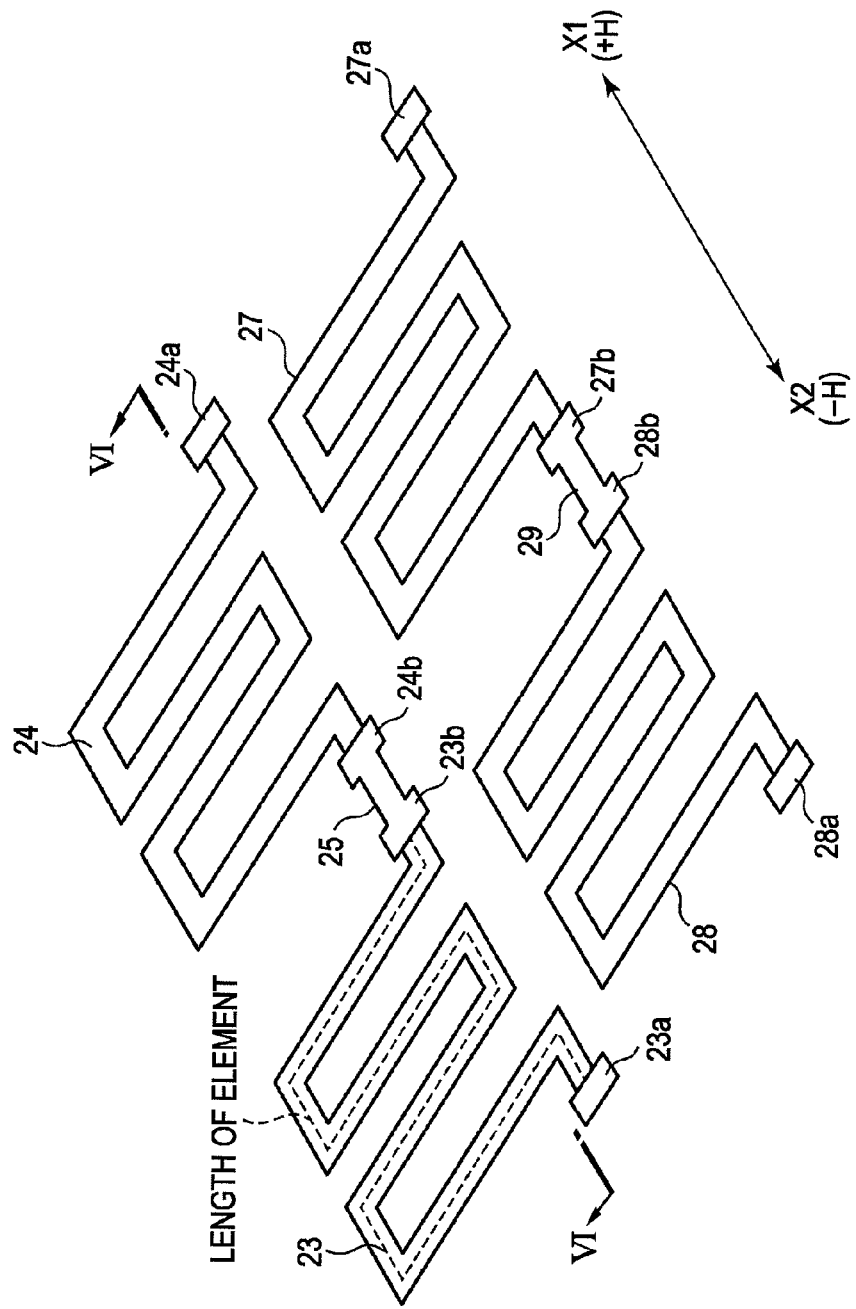
FIG. 5 is a fragmentary perspective view of the plane structure of resistors disposed in the magnetic detecting device according to the embodiment of the invention.
Figure 6:
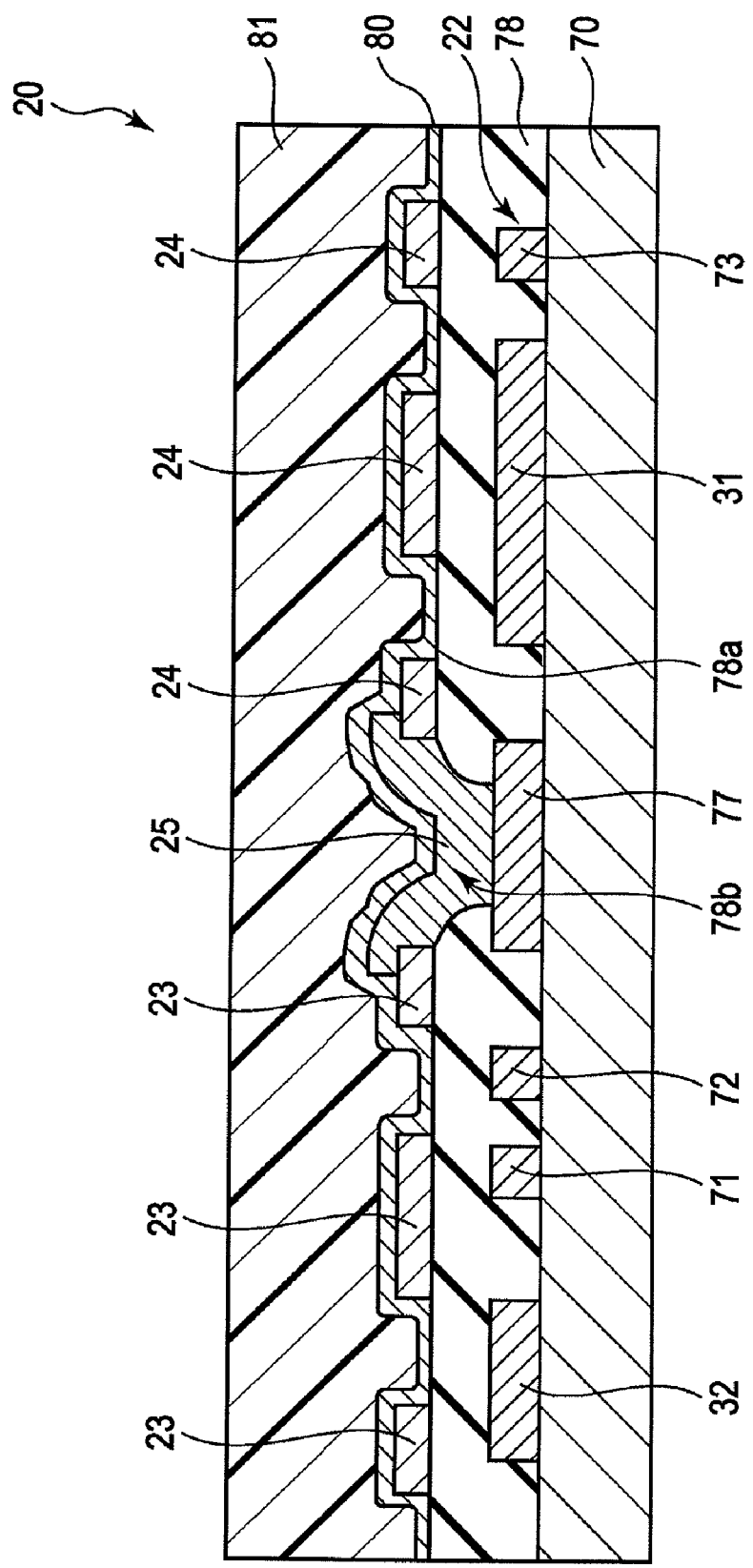
FIG. 6 is a fragmentary sectional view of the magnetic detecting device taken along line VI-VI in the thickness direction, viewed in the direction designated by the arrow.
Figure 7:
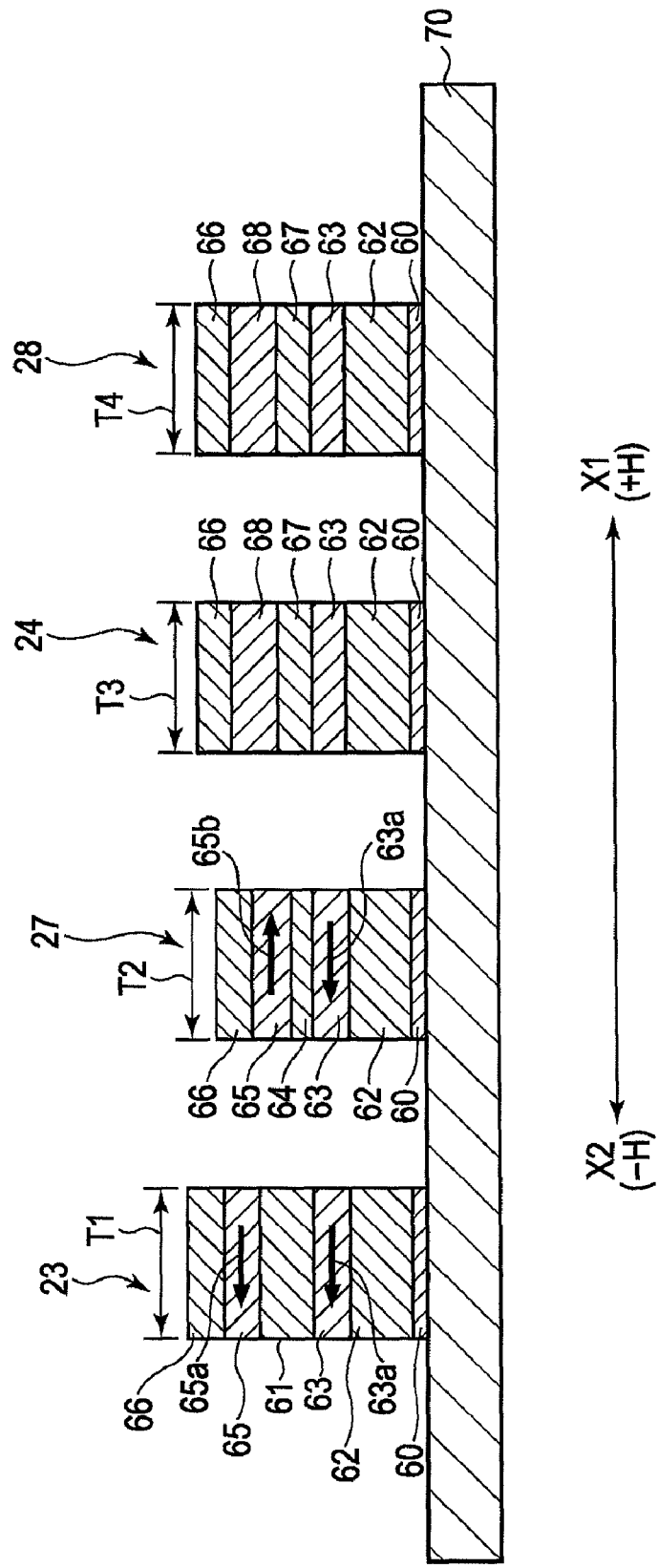
FIG. 7 is a fragmentary sectional view of layer structures of the first magnetoresistive element, the second magnetoresistive element, the first fixed resistor, and the second fixed resistor.
Figure 8:
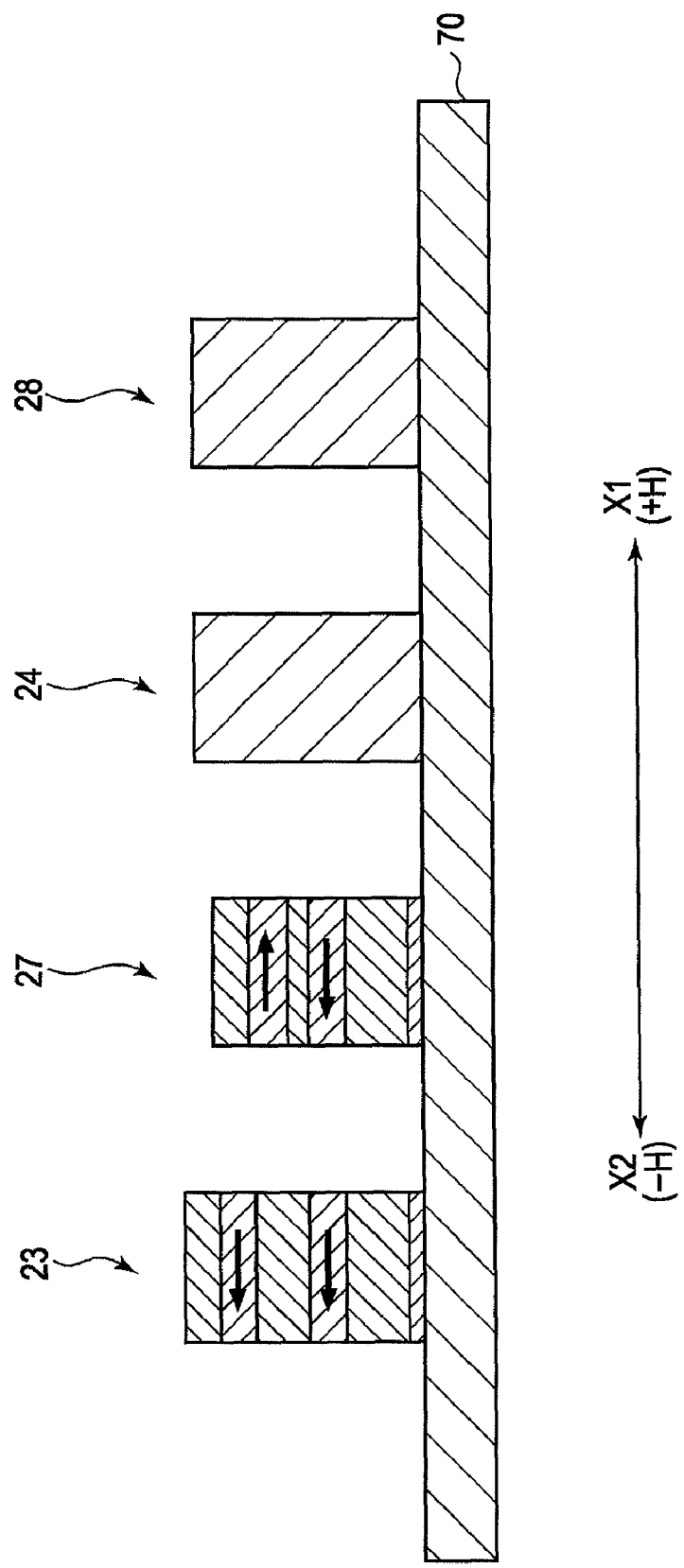
FIG. 8 is a fragmentary sectional view of layer structures of the first magnetoresistive element, the second magnetoresistive element, the first fixed resistor, and the second fixed resistor in which the first and the second fixed resistors have different layer structure from those shown in FIG. 7.

FIGS. 1 and 2 are circuit diagrams of a magnetic detecting device 20 according to an embodiment of the present invention; FIG. 3 is an R-H curve of the first magnetoresistive element of the magnetic detecting device 20 of the embodiment; FIG. 4 is an R-H curve of the second magnetoresistive element of the magnetic detecting device 20; FIG. 5 is a perspective view of the plane structure of resistors disposed in the magnetic detecting device 20 of the embodiment; FIG. 6 is a fragmentary sectional view of the magnetic detecting device taken along line VI-VI in the thickness direction, viewed in the direction designated by the arrow; FIG. 7 is a fragmentary sectional view of layer structures of the first magnetoresistive element, the second magnetoresistive element, the first fixed resistor, and the second fixed resistor; FIG. 8 is a fragmentary sectional view of other layer structures of the first magnetoresistive element, the second magnetoresistive element, the first fixed resistor, and the second fixed resistor; and FIGS. 9 to 12 are fragmentary schematic side views and a fragmentary plan view of a folding cellular phone containing the magnetic detecting device being an application of the magnetic detecting device of the embodiment.

The magnetic detecting device (magnetic sensor) 20 of the present embodiment shown in FIG. 1 includes a resistor section 21 and an integrated circuit (IC) 22.

The resistor section 21 includes a first series circuit 26 in which a first magnetoresistive element 23 and a first fixed resistor 24 are connected in series through a first output extraction portion (junction) 25 and a second series circuit 30 in which a second magnetoresistive element 27 and a second fixed resistor 28 are connected in series through a second output extraction portion (junction) 29.

The integrated circuit 22 includes a third series circuit 34 in which a third fixed resistor 31 and a fourth fixed resistor 32 are connected in series through a third output extraction portion 33.

The first series circuit 26 and the second series circuit 30 each constitute bridge circuits as common circuits with the third series circuit 34. In the following description, the bridge circuit formed by connecting the first series circuit 26 and the third series circuit 34 in parallel is referred to as the first bridge circuit BC1, and the bridge circuit formed by connecting the second series circuit 30 and the third series circuit 34 in parallel is referred to as the second bridge circuit BC2.

In the first bridge circuit BC1, the first magnetoresistive element 23 and the fourth fixed resistor 32 are connected in parallel and the first fixed resistor 24 and the third fixed resistor 31 are connected in parallel, as shown in FIG. 1, Also, in the second bridge circuit BC2, the second magnetoresistive element 27 and the third fixed resistor 31 are connected in parallel and the second fixed resistor 28 and the fourth fixed resistor 32 are connected in parallel.

As shown in FIG. 1, the integrated circuit 22 has an input terminal (power source) 39, a ground terminal 42, and two external output terminals 40 and 41. The input terminal 39, the ground terminal 42, and the external output terminals 40 and 41 are each electrically connected to a terminal of an external apparatus (not shown) by wire bonding, die bonding, or the like.

A line 50 connected to the input terminal 39 and a line 51 connected to the ground terminal 42 are each connected to the electrodes provided at one ends of the first series circuit 26, the second series circuit 30, and the third series circuit 34.

The integrated circuit 22 has a single differential amplifier 35 in it, as shown in FIG. 1, and the third output extraction portion 33 of the third series circuit 34 is connected to one of the (+)-input portion and the (−)-input portion of the differential amplifier 35.

The first output extraction portion 25 of the first series circuit 26 and the second output extraction portion 29 of the second series circuit 30 are connected to the respective input portions of a first switching circuit (first connection switching portion) 36, and the output portion of the first switching circuit 36 is connected to the other input portion of the differential amplifier 35 (input portion to which the third output extraction portion 33 is not connected).

The output portion of the differential amplifier 35 is connected to a Schmidt trigger comparator 38, and the output portion of the comparator 38 is connected to the input portion of a second switching circuit (second connection switching portion) 43. The output portions of the second switching circuit 43 are connected to the first external output terminal 40 and the second external output terminal 41 through two latching circuits 46 and 47 and FET circuits 54 and 55, respectively. The FET circuits 54 and 55 are logical circuits.

In addition, the integrated circuit 22 has a third switching circuit 48 in it. The output portion of the third switching circuit 48 is connected to the line 51 connected to the ground terminal 42, and the input portion of the third switching circuit 48 is connected to terminals of the first series circuit 26 and the second series circuit 30.

In addition, the integrated circuit 22 has an interval switching circuit 52 and a clock circuit 53 in it. When the interval switching circuit 52 is switched to OFF, the current to the integrated circuit 22 is removed. The ON/OFF switching operation of the interval switching circuit 52 is interlocked with the clock signal from the clock circuit 53, and the interval switching circuit 52 performs intermittent energization to save power.

The clock signal from the clock circuit 53 is also output to the switching circuit 36, the second switching circuit 43, and the third switching circuit 48. The first switching circuit 36, the second switching circuit 43, and the third switching circuit 48 are controlled so that when they receive a clock signal, the clock signal is divided for switching operation at very short intervals. For example, a clock signal having a pulse of several tens of milliseconds switches a circuit every several tens of microseconds.

The first magnetoresistive element 23 is a GMR element producing a giant magnetoresistive effect (GMR effect) according to the variation in intensity of the (+H)-direction external magnetic field, and the second magnetoresistive element 27 is a GMR element producing a giant magnetoresistive effect (GMR EFFECT) according to the variation in intensity of the opposite (−H)-direction external magnetic field.

The (+H)-direction external magnetic field is oriented in a direction. For example, in the present embodiment, the (+H)-direction external magnetic field is oriented in the X1 direction shown in figures (e.g. FIG. 5), and the (−H)-direction external magnetic field is oriented in the X2 direction shown in the figures.

The sectional structure of the magnetic detecting device 20 will now be described with reference to FIG. 6. As shown in FIG. 6, the magnetic detecting device 20 includes the integrated circuit 22 including active elements 71 to 73, such as a differential amplifier and a comparator, the third fixed resistor 31, the fourth fixed resistor 32, and a wiring layer 77 on a substrate 70. The wiring layer 77 is made of, for example, aluminum (Al).

The substrate 70 and the integrated circuit 22 are covered with an insulating layer 78 made of a resist. The insulating layer 78 has a hole 78b in the portion over the wiring layer, and the upper surface of the wiring layer 78 is exposed in the hole 78b.

The surface 78a of the insulating layer 78 is planarized, and the first magnetoresistive element 23, the first fixed resistor 24, the second magnetoresistive element 27, and the second fixed resistor 28 are disposed in a meandering manner on the planarized surface 78a of the insulating layer 78, as shown in FIG. 5. By forming the elements in a meandering manner, the elements can have sufficient lengths to ensure high resistances.

As shown in FIG. 5, the elements 23, 24, 27, and 28 have electrodes 23a and 23b, 24a and 24b, 27a and 27b, and 28a and 28b at both ends, respectively. One electrode 23b of the first magnetoresistive element 23 and one electrode 24b of the first fixed resistor 24 are connected with the first output extraction portion 25, and the first output extraction portion 25 is electrically connected to the wiring layer 77 as shown in FIG. 6. In the same manner, one electrode 27b of the second magnetoresistive element 27 and one electrode 28b of the second fixed resistor 28 are connected with the second output extraction portion 29, and the second output extraction portion 29 is electrically connected to another wiring layer (not shown).

As shown in FIG. 6, the elements, the electrodes, and the output extraction portions are covered with an insulating layer 80 made of, for example, alumina or silica. The magnetic detecting device 20 is thus packaged with a molding resin 81.

The layer structure and the R-H curve of the first and second magnetoresistive elements 23 and 27 will now be described in detail.

FIG. 7 is a sectional view of the first magnetoresistive element 23, the second magnetoresistive element 27, the first fixed resistor 24, and the second fixed resistor 28 when they are disposed in a row on a substrate 70. Each sectional structure of the elements is the same as the sectional structure of the corresponding element shown in FIG. 5 taken along line VI-VI in the thickness direction.

As shown in FIG. 7, the first and second magnetoresistive elements 23 and 27 each include an underlayer 60, an antiferromagnetic layer 62, a pinned magnetic layer 63, a nonmagnetic conductive layer 61 or 64 (designated by 61 for the nonmagnetic conductive layer of the first magnetoresistive element 23, and designated by 64 for the nonmagnetic conductive layer of the second magnetoresistive element 27), a free magnetic layer 65, and a protective layer 66, and these layers are formed in that order from below.

The underlayer 60 is made of, for example, at least one of nonmagnetic materials, such as Ta, Hf, Nb, Zr, Ti, Mo, and W. The antiferromagnetic layer 62 is made of an antiferromagnetic material containing element α (wherein element α is at least one of elements Pt, Pd, Ir, Rh, Ru, and Os) and Mn, or an antiferromagnetic material containing element α, element α' (wherein element α' is at least one of elements Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements), and Mn. For example, the antiferromagnetic layer 62 is made of IrMn or PtMn. The pinned magnetic layer 63 and the free magnetic layer 65 are made of a magnetic material, such as a CoFe alloy, a NiFe alloy, or a CoFeNi alloy. The nonmagnetic conductive layers 61 and 64 are made of a nonmagnetic metal. Preferably, the nonmagnetic conductive layers 61 and 64 are made of Cu. The protective layer 66 is made of, for example, Ta. The pinned magnetic layer 63 and the free magnetic layer 65 may each have a multilayer ferrimagnetic structure (magnetic layer/nonmagnetic interlayer/magnetic layer structure, and the two magnetic layers between which the nonmagnetic layer is disposed are magnetized in anti-parallel directions to each other). The pinned magnetic layer 63 and the free magnetic layer 65 may each be defined by a plurality of magnetic layers made of different materials. The layers of the multilayer structure may be this order from below: underlayer 60, free magnetic layer 65, nonmagnetic conductive layer 61 or 64, pinned magnetic layer 63, antiferromagnetic layer 62, and protective layer 66.

In the first magnetoresistive element 23 and the second magnetoresistive element 27, the antiferromagnetic layer 62 and the pinned magnetic layer 63 are in contact with each other. Therefore an exchange coupling magnetic field (Hex) is generated at the interface between the antiferromagnetic layer 62 and the pinned magnetic layer 63 by heat treatment in a magnetic field, thereby fixing the magnetization of the pinned magnetic layer 63 in a direction. In FIG. 7, the direction of the magnetization 63a of the pinned magnetic layer 63 is indicated by an arrow. The magnetizations 63a of the pinned magnetic layers 63 of the first magnetoresistive element 23 and the second magnetoresistive element 27 are oriented in the X2 direction.

On the other hand, the magnetization direction of the free magnetic layer 65 is different between the first magnetoresistive element 23 and the second magnetoresistive element 27 when the elements are in no magnetic field (in a state in which no external magnetic field acts on the elements). As shown in FIG. 7, the free magnetic layer 65 of the first magnetoresistive element 23 is magnetized in the X2 direction (65a), or in the same direction as the magnetization 63a direction of the pinned magnetic layer 63. In contrast, the free magnetic layer 65 of the second magnetoresistive element 27 is magnetized in the X1 direction (65b), or in the direction anti-parallel to the magnetization 63a direction of the pinned magnetic layer 63.

When a (+H)-direction external magnetic field is applied, the magnetization 65b direction of the free magnetic layer 65 of the second magnetoresistive element 27 is not changed, but the magnetization 65a direction of the free magnetic layer 65 of the first magnetoresistive element 23 is changed to vary the resistance of the first magnetoresistive element 23. FIG. 3 is an R-H curve of the first magnetoresistive element 23. When the external magnetic field is gradually increased in the (+H) direction from zero (in a state of no magnetic field), as shown in FIG. 3, the parallel relationship between the magnetization 65a direction of the free magnetic layer 65 and the magnetization 63a direction of the pinned magnetic layer 63 is broken and changed into a state anti-parallel to each other. Consequently, the resistance R of the first magnetoresistive element 23 traces a curve HR1 to increase gradually. When the (+H)-direction external magnetic field is gradually reduced, the resistance R of the first magnetoresistive element 23 traces a curve HR2 to reduce gradually.

The R-H curve of the first magnetoresistive element 23 forms a loop L1 with the curves HR1 and HR2 for changes in intensity of the (+H)-direction external magnetic field. The midpoint of the loop L1 lies at the intermediate point between the maximum resistance and the minimum resistance of the first magnetoresistive element 23 and at the center of the width of the loop L1. The magnitude of the first interlayer coupling magnetic field Hin 1 acting between the free magnetic layer 65 and the pinned magnetic layer 63 is determined by the intensity of the magnetic field between the midpoint of the loop L1 and the line of external magnetic field H=0 (Oe). As shown in FIG. 3, the first interlayer coupling magnetic field Hin 1 of the first magnetoresistive element 23 is shifted in the direction of the (+H)-external magnetic field.

On the other hand, when a (−H)-direction external magnetic field is applied, the magnetization 65a direction of the free magnetic layer 65 of the first magnetoresistive element 23 is not changed, but the magnetization 65b direction of the free magnetic layer 65 of the second magnetoresistive element 27 is changed to vary the resistance of the second magnetoresistive element 27.

FIG. 4 is an R-H curve of the second magnetoresistive element 27. When the external magnetic field is gradually increased in the (−H) direction from zero (in a state of no magnetic field), as shown in FIG. 4, the anti-parallel relationship between the magnetization 65b direction of the free magnetic layer 67 and the magnetization direction 63a of the pinned magnetic layer 63 is broken and changed into a state parallel to each other. Consequently, the resistance R of the second magnetoresistive element 27 traces a curve HR3 to decrease gradually. When the (−H)-direction external magnetic field is gradually reduced, the resistance R of the second magnetoresistive element 27 traces a curve HR4 to increase gradually.

The R-H curve of the second magnetoresistive element 27 forms a loop L2 with the curves HR3 and HR4 for changes in intensity of the (−H)-direction external magnetic field. The midpoint of the loop L2 lies at the intermediate point between the maximum resistance and the minimum resistance of the second magnetoresistive element 27 and at the center of the width of the loop L2. The magnitude of the second interlayer coupling magnetic field Hin 2 acting between the free magnetic layer 65 and the pinned magnetic layer 63 is determined by the intensity of the magnetic field between the midpoint of the loop L2 and the line of external magnetic field H=0 (Oe). As shown in FIG. 4, the second interlayer coupling magnetic field Hin 2 of the second magnetoresistive element 27 is shifted in the direction of the (−H)-external magnetic field.

Letting the magnitudes of the (+H)-direction external magnetic field and the (−H)-direction external magnetic field be positive and negative, respectively, the first interlayer coupling magnetic field Hin 1 has a positive value and the second interlayer coupling magnetic field Hin 2 has a negative value. The first interlayer coupling magnetic field Hin 1 and the second interlayer coupling magnetic field Hin 2 are thus opposite.

In the present embodiment, the first magnetoresistive element 23 and the second magnetoresistive element 27 have the same layer structure except that the nonmagnetic conductive layers 61 and 64 have different thicknesses. The same layer structure means that two elements include the same material layers and that the corresponding layers made of the same material of the two elements have the same thickness.

The first magnetoresistive element 23 and the second magnetoresistive element 27 are constituted of the layers made of the same materials. For example, both the underlayers 60 of the first magnetoresistive element 23 and the second magnetoresistive element 27 are made of Ta. Both the antiferromagnetic layers 62 of the first magnetoresistive element 23 and the second magnetoresistive element 27 are made of InMn. Both the pinned magnetic layers 63 of the first magnetoresistive element 23 and the second magnetoresistive element 27 are made of CoFe. Both the nonmagnetic conductive layers 61 and 64 of the first magnetoresistive element 23 and the second magnetoresistive element 27 are made of Cu. Both the free magnetic layers 65 of the first magnetoresistive element 23 and the second magnetoresistive element 27 are made of NiFe. Both the protective layers 66 of the first magnetoresistive element 23 and the second magnetoresistive element 27 are made of Ta.

In addition, the thicknesses of the underlayer 60, the antiferromagnetic layer 62, the pinned magnetic layer 63, the free magnetic layer 65, and the protective layer 66 are the same between the first magnetoresistive element 23 and the second magnetoresistive element 27, except for the nonmagnetic conductive layers 61 and 64.

If the antiferromagnetic layer 62, the pinned magnetic layer 63, and the free magnetic layer 65 have different thicknesses between the first magnetoresistive element 23 and the second magnetoresistive element 27, the TCRs of the first magnetoresistive element 23 and the second magnetoresistive element 27 significantly differ from each other. By forming the first magnetoresistive element 23 and the second magnetoresistive element 27 using the same material layers such that the corresponding layers have the same thickness, except for the nonmagnetic conductive layers 61 and 64, the TCRs of the first magnetoresistive element 23 and the second magnetoresistive element 27 can be set substantially to the same value.

In the present embodiment, the nonmagnetic conductive layer 61 of the first magnetoresistive element 23 has a different thickness from the nonmagnetic conductive layer 64 of the second magnetoresistive element 27, as shown in FIG. 7.

Figure 13:
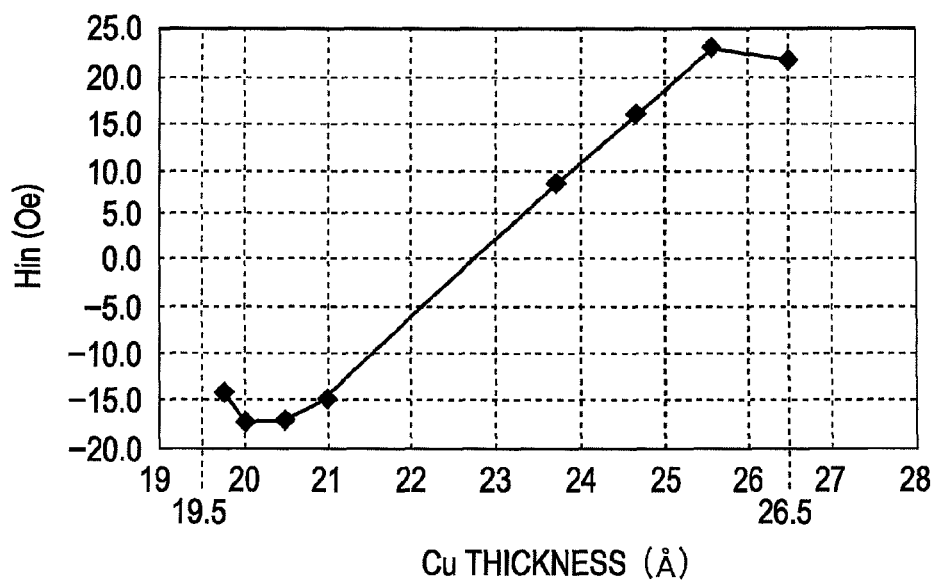
FIG. 13 is a plot showing the relationship between the thickness of a nonmagnetic conductive layer (Cu) and the interlayer coupling magnetic field Hin.

FIG. 13 is a plot showing the relationship between the thickness of the Cu layer of a magnetoresistive element having the following structure and the interlayer coupling magnetic field Hin of the magnetoresistive element (changes in interlayer coupling magnetic field with Cu layer thickness).

The magnetoresistive element used in the experiment has the structure: NiFeCr seed layer (42)/IrMn antiferromagnetic layer (60)/CoFe pinned magnetic layer (20)/Cu nonmagnetic conductive layer (X)/NiFe free magnetic layer (40)/Ta protective layer (30). Numbers in parentheses are thicknesses in angstrom.

In the experiment, the changes in interlayer coupling magnetic field Hin were measured while the thickness of the Cu layer was varied.

FIG. 13 shows that the variation in Cu layer thickness changes the interlayer coupling magnetic field Hin. As shown in FIG. 13, the interlayer coupling magnetic field Hin is negative for a Cu layer having a thickness of, for example, 20 Å, but is positive for a Cu layer having a thickness of, for example, 26 Å.

This means that the first magnetoresistive element 23 and the second magnetoresistive element 27 can have a positive interlayer coupling magnetic field Hin 1 and a negative interlayer coupling magnetic field Hin 2 respectively, by forming the nonmagnetic conductive layer 61 of the first magnetoresistive element 23 and the nonmagnetic conductive layer 64 of the second magnetoresistive element 27 to different thicknesses from each other.

According to the results shown in FIG. 13, by forming the nonmagnetic conductive layer 61 of Cu to a thickness in the range of 24 to 26.5 Å in the first magnetoresistive element 23, a positive interlayer coupling magnetic field Hin 1 can be produced and which can be stable to changes in Cu thickness. More preferably, the thickness of the nonmagnetic conductive layer 61 is in the range of 25 to 26.5 Å.

Also, by forming the nonmagnetic conductive layer 64 of Cu to a thickness in the range of 19.5 to 21 Å in the second magnetoresistive element 27, a negative interlayer coupling magnetic field Hin 2 can be produced and which can be stable to changes in Cu thickness.

Figure 14:
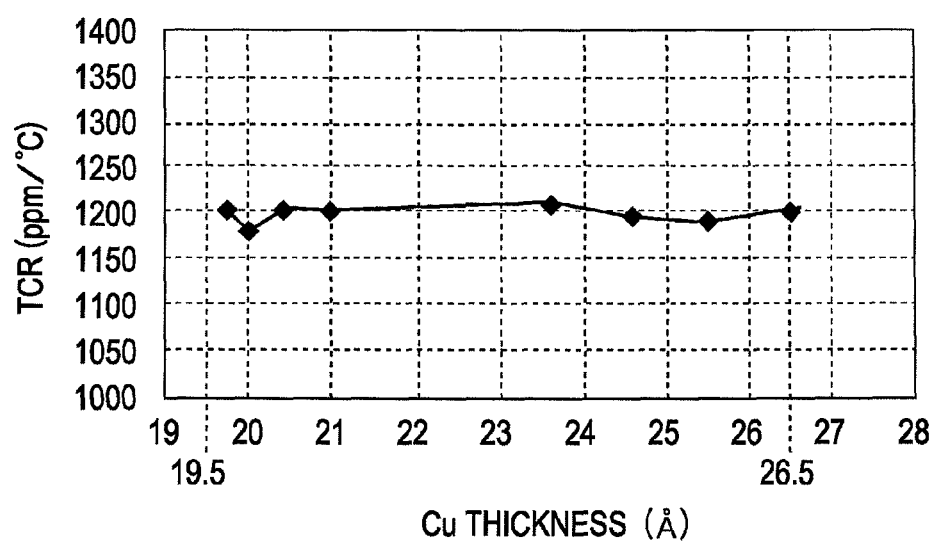
FIG. 14 is a plot showing the relationship between the thickness of a nonmagnetic conductive layer (Cu) and the TCR.

FIG. 14 shows the relationship between the Cu thickness and the TCR. In the experiment shown in FIG. 14, the TCRs of the magnetoresistive elements used in the experiment shown in FIG. 13 were measured.

As shown in FIG. 14, the TCR was substantially constant even though the thickness of the Cu layer was varied.

The first fixed resistor 24 connected in series to the first magnetoresistive element 23 and the second fixed resistor 28 connected in series to the second magnetoresistive element 27 have the same layer structure as each other.

While the first fixed resistor 24 and the second fixed resistor 28 of the present embodiment shown in FIG. 7 includes layers made of the same materials as the first and the second magnetoresistive elements 23 and 27, the multilayer structure of the fixed resistors 24 and 28 are different from the first and second magnetoresistive elements 23 and 27 in that the magnetic layer 67 corresponding to the free magnetic layer 65 of the magnetoresistive element and the nonmagnetic conductive layer 68 are disposed in an inverse order.

More specifically, the first fixed resistor 24 and the second fixed resistor 28 each include an underlayer 60, an antiferromagnetic layer 62, a pinned magnetic layer 63, a magnetic layer 67, a nonmagnetic conductive layer 68, and a protective layer 66 in that order from below.

Since the pinned magnetic layer 63 and the magnetic layer 67 of the first and second fixed resistors 24 and 28 are continuously disposed in that order on the antiferromagnetic layer 62, the magnetizations of the pinned magnetic layer 63 and the magnetic layer 67 are fixed by the exchange coupling magnetic field (Hex) generated with the antiferromagnetic layer 62 and the ferromagnetic coupling between the pinned magnetic layer 63 and the magnetic layer 67. Thus, the magnetic layer 67 made of the same material as the free magnetic layer 65 of the magnetoresistive elements 23 and 27 does not change the magnetization depending on the external magnetic field, unlike the free magnetic layer 65 of the magnetoresistive elements 23 and 27.

Hence, the electric resistances of the first fixed resistor 24 and the second fixed resistor 28 are not affected by the external magnetic field.

The thicknesses of the underlayer 60, the antiferromagnetic layer 62, the pinned magnetic layer 63, the magnetic layer 67, the nonmagnetic conductive layer 68, and the protective layer 66 are each the same between the first fixed resistor 24 and the second fixed resistor 28.

Consequently, the first fixed resistor 24 and the second fixed resistor 28 have the same TCR. In this instance, a TCR error of 50 ppm/° C. or less is negligible.

Although the same layers of the magnetoresistive elements 23 and 27 and the fixed resistors 24 and 28 have the same thicknesses (except for the nonmagnetic conductive layer) in the embodiment shown in FIG. 7, the thicknesses may be different.

One important point here is not the relationship between the film structures of the magnetoresistive elements 23 and 27, but the structural relationship between the fixed resistors 24 and 28. Accordingly, the thicknesses of the antiferromagnetic layers 62 of the first and second fixed resistors 24 and 28 are the same as each other, but may be different from thicknesses of the antiferromagnetic layers 62 of the magnetoresistive elements 23 and 27.

It is however preferable that the same layers of the magnetoresistive elements 23 and 27 and the fixed resistors 24 and 28 have the same thicknesses (except for the nonmagnetic conductive layer). Such a structure facilitates the adjustment of the TCRs between the magnetoresistive elements 23 and 27 and the respective fixed resistors 24 and 28.

Unlike the magnetoresistive elements 23 and 27, the nonmagnetic conductive layers 68 of the first fixed resistor 24 and the second fixed resistor 28 have the same thickness. Since the thicknesses of the nonmagnetic conductive layers 61 and 64 of the first magnetoresistive element 23 and the second magnetoresistive element 27 are different, the nonmagnetic conductive layers 61, 64, and 68 of the first magnetoresistive element 23, the second magnetoresistive element 27, and the first and second fixed resistors 24 and 28 cannot have the same thickness. However, the TCR is hardly affected by changes in thickness of the nonmagnetic conductive layer, as shown in FIG. 14. Accordingly, the first fixed resistor 24 and the second fixed resistor 28 can be given substantially the same TCR as the first magnetoresistive element 23 and the second magnetoresistive element 27 by forming the same layers of the first and second magnetoresistive elements 23 and 27 and the first and second fixed resistors 24 and 28 to the same thicknesses (except for the nonmagnetic conductive layer), even though the thicknesses of the nonmagnetic conductive layers 68 of the first and second fixed resistors 24 and 28 are different from those of the nonmagnetic conductive layers 61 and 64 of the first and second magnetoresistive elements 23 and 27, or the thicknesses of the nonmagnetic conductive layers 61 and 64 of the first and second magnetoresistive elements 23 and 27 are different from each other.

When the nonmagnetic conductive layer is made of Cu as shown in FIG. 13, the preferred thickness of the nonmagnetic conductive layer 61 of the first magnetoresistive element 23 is set in the range of 24 to 26.5 Å, and the preferred thickness of the nonmagnetic conductive layer 64 of the second magnetoresistive element 27 is set in the range of 19.5 to 21 Å. Also, a nonmagnetic conductive layer 68 having a thickness in the range of 19.5 to 26.5 Å allows the TCR of the fixed resistor to be controlled to about 1200 ppm/° C. as shown in FIG. 14. For the Cu nonmagnetic conductive layer 68 of the first and second fixed resistors 24 and 28, the thickness of the nonmagnetic conductive layer 61 of the first magnetoresistive element 23 is set in the range of 24 to 26.5 Å; the thickness of the nonmagnetic conductive layer 64 of the second magnetoresistive element 27 is set in the range of 19.5 to 21 Å; and the thickness of the nonmagnetic conductive layer 68 of the first and second fixed resistors 24 and 28 is set in the range of 19.5 to 26.5 Å. Thus, the TCRs of the first magnetoresistive element 23, the second magnetoresistive element 27, the first and second fixed resistors 24 and 28 can be appropriately controlled to substantially the same value.

While the first and second fixed resistors 24 and 28 include the layers made of the same materials as the layers of the first and second magnetoresistive elements 23 and 27 in the embodiment shown in FIG. 7, the multilayer structure of the first and second fixed resistors 24 and 28 is not limited to that shown in FIG. 7, as long as the first and second fixed resistors 24 and 28 have substantially the same TCR as the first and second magnetoresistive elements 23 and 27.

For example, the first and second fixed resistors 24 and 28 may each have a single structure made of the same material, as shown in FIG. 8. In this instance, the thicknesses of the first fixed resistor 24 and the second fixed resistor 28 are adjusted to the same value and so that the fixed resistors 24 and 28 have substantially the same TCR as the first and second magnetoresistive elements 23 and 27.

Such first and second fixed resistors 24 and 28 having the same single-layer structure facilitates the formation of the fixed resistors 24 and 28. The first fixed resistor 24 and the second fixed resistor 28 can be formed of, for example, a Cr single layer.

In the embodiment shown in FIG. 7, the widths T1 to T4 of the first magnetoresistive element 23, the second magnetoresistive element 27, the first fixed resistor 24, and the second fixed resistor 28 are all the same as each other. At least, the widths T1 and T2 of the first and second magnetoresistive elements 23 and 27 are set to the same value and the widths T3 and T4 of the first and second fixed resistors 24 and 28 are set to the same value.

In addition, the embodiment shown in FIG. 5, the lengths of the first magnetoresistive element 23, the second magnetoresistive element 27, the first fixed resistor 24, and the second fixed resistor 28 are all the same as each other. The length of each element is defined by the length along the line running through the center of the width of the element.

In comparison between the first magnetoresistive element 23 and the second magnetoresistive element 27, these two magnetoresistive elements 23 and 27 have the same plane structure. In comparison between the first fixed resistor 24 and the second fixed resistor 28, also, these two fixed resistors 24 and 28 have the same plane structure.

However, the nonmagnetic conductive layers 61 and 64 of the first magnetoresistive element 23 and the second magnetoresistive element 27 have different thicknesses from each other as shown in FIG. 7. Accordingly, the first and second magnetoresistive elements 23 and 27 having the same plane structure have different electric resistances when the elements are in no magnetic field. Preferably, the lengths of the first magnetoresistive element 23 and the second magnetoresistive element 27 are adjusted to differ slightly from each other so that the first magnetoresistive element 23 and the second magnetoresistive element 27 have the same electric resistance in no magnetic field. At this point, the electric resistances of the first and second fixed resistors 24 and 28 are adjusted to the same value as those of the first and second magnetoresistive elements 23 and 27. Consequently, a midpoint potential can be obtained from each output extraction portion in no magnetic field.

In order to obtain a midpoint potential, the electric resistances of the first magnetoresistive element 23 and the first fixed resistor 24 connected in series to each other can be set to the same value, and the electric resistances of the second magnetoresistive element 27 and the second fixed resistor 28 connected in series to each other can also be set to the same value. For example, the first and second magnetoresistive elements 23 and 27 are formed in the same plane shape, and the first fixed resistor 24 and the second fixed resistor 28 are formed at different lengths so that the fixed resistors 24 and 28 each have the same electric resistance as the magnetoresistive element 23 or 27 connected to the fixed resistor in series even though the first magnetoresistive element 23 and the second magnetoresistive element 27 have different electric resistances in no magnetic field. Even though the first and second fixed resistors 24 and 28 have different lengths, they can be formed in the same process step because they have the same layer structure.

A deviation of the midpoint potential can be corrected by the integrated circuit 22.

In the present embodiment, as described above, the first magnetoresistive element 23 and the second magnetoresistive element 27 have the same multilayer structure except that the nonmagnetic conductive layers 61 and 64 have different thicknesses. The variation in thickness of the nonmagnetic conductive layers 61 and 64 does not affect the TCRs much. Accordingly, the above-described layer structure allows the first and second magnetoresistive elements 23 and 27 to have substantially the same TCR. Also, a positive first interlayer coupling magnetic field Hin 1 and a negative second interlayer coupling magnetic field Hin 2 are given to the first magnetoresistive element 23 and the second magnetoresistive element 27 respectively by forming the nonmagnetic conductive layers 61 and 64 of the first and second magnetoresistive elements 23 and 27 to different thicknesses.

In the known process, the first magnetoresistive element and the second magnetoresistive element have different TCRs. Accordingly, the fixed resistors are separately formed to adjust the TCRs to the TCRs of the respective magnetoresistive elements connected in series.

On the other hand, in the present embodiment, the first and second magnetoresistive elements 23 and 27 can be configured to have substantially the same TCR. Accordingly, the TCRs of the first and second fixed resistors 24 and 28 can be set to substantially the same value as the TCRs of the first and second magnetoresistive elements 23 and 27 even though the first and second fixed resistors 24 and 28 have the same layer structure. Thus, the first fixed resistor 24 and the second fixed resistor 28 can be formed in the same step. Consequently, the manufacturing process of the magnetic detecting device 20 can be simplified.

The third fixed resistor 31 and the fourth fixed resistor 32 are disposed in the integrated circuit 22, as shown in FIG. 1, but may be provided in the resistor section 21. In this instance, the first fixed resistor 24, the second fixed resistor 28, the third fixed resistor 31, and the fourth fixed resistor 32 can be all prepared in the same process step.

The principle of external magnetic field detection will now be described.

When a (+)-direction external magnetic field acts on the magnetic detecting device 20 of the present embodiment, the electric resistance of the first magnetoresistive element 23 is varied to shift the potential at the first output extraction portion 25 of the first series circuit 26 from the midpoint potential.

In the state shown in FIG. 1, the differential amplifier 35 produces a differential potential between the first output extraction portion 25 and the third output extraction portion 33 of the first bridge circuit BC1 formed with the first series circuit 26 and the third series circuit 34 with reference to the midpoint potential of the third output extraction portion 33 of the third series circuit 34, and transmits the differential potential to the comparator 38. The comparator 38 shapes the differential potential into a pulsed signal by Schmitt trigger input, and the shaped magnetic field detection signal is output from the first external output terminal 40 through a latching circuit 46 and an FET circuit 54.

On the other hand, in the magnetic detecting device 20 on which the (+H)-direction external magnetic field acts, the resistance of the second magnetoresistive element 27 does not vary even if the first switching circuit 36 and the second switching circuit 43 are switched to the sate shown in FIG. 2. The output from the second external output terminal 41 does not change as in the case where no external magnetic field acts on.

When a (+H)-direction external magnetic field acts on the magnetic detecting device 20, a magnetic field detection signal thus can be obtained from the first external output terminal 40.

When a (−)-direction external magnetic field acts on the magnetic detecting device 20 of the present embodiment, the electric resistance of the second magnetoresistive element 27 is varied to shift the potential at the second output extraction portion 29 of the second series circuit 30 from the midpoint potential.

In the state shown in FIG. 2, the differential amplifier 35 produces a differential potential between the second output extraction portion 29 and the third output extraction portion 33 of the second bridge circuit BC2 formed with the second series circuit 30 and the third series circuit 34 with reference to the midpoint potential of the third output extraction portion 33 of the third series circuit 34, and transmits the differential potential to the comparator 38. The comparator 38 shapes the differential potential into a pulsed signal by Schmitt trigger input, and the shaped magnetic field detection signal is output from the second external output terminal 41 through the latching circuit 46 and the FET circuit 54.

On the other hand, in the magnetic detecting device 20 on which the (−H)-direction external magnetic field acts, the resistance of the first magnetoresistive element 23 does not vary even if the circuits are switched to the state as shown in FIG. 1. The output from the first external output terminal 40 does not change as in the case where no external magnetic field acts on.

Thus, a magnetic field detection signal can be obtained from the second external output terminal 41 when a (−H)-direction external magnetic field acts on the magnetic detecting device 20.

Applications of the bidirectional type magnetic detecting device 20 of the present embodiment will now be described. The magnetic detecting device 20 of the present embodiment can be applied to, for example, the open/close detection of turnover type folding cellular phones.

Figure 9:
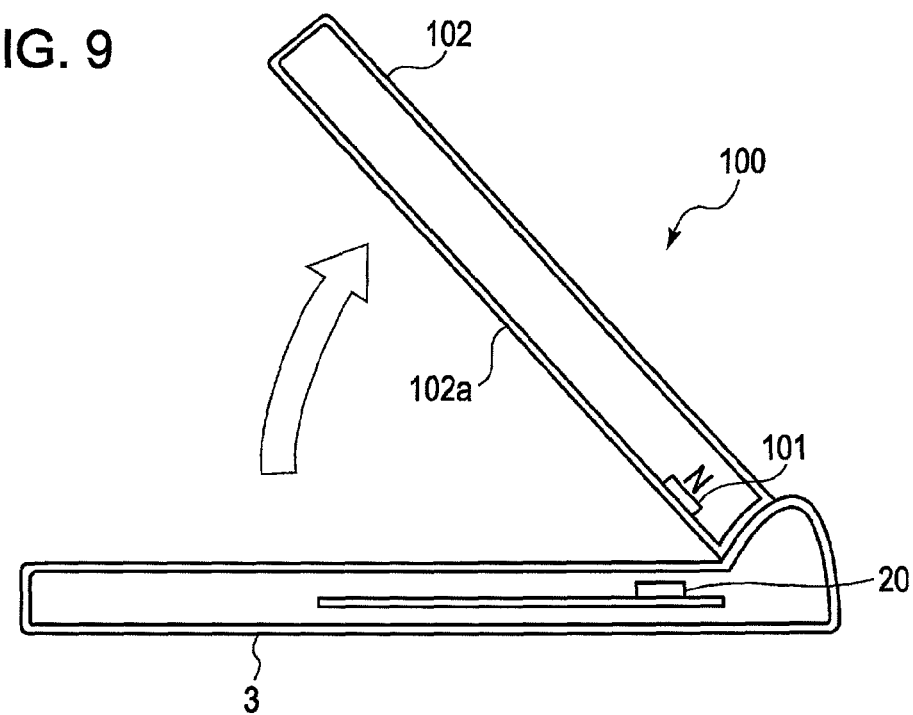
FIG. 9 is a fragmentary schematic side view of a folding cellular phone containing a magnetic detecting device according to an embodiment of the invention.
Figure 10:
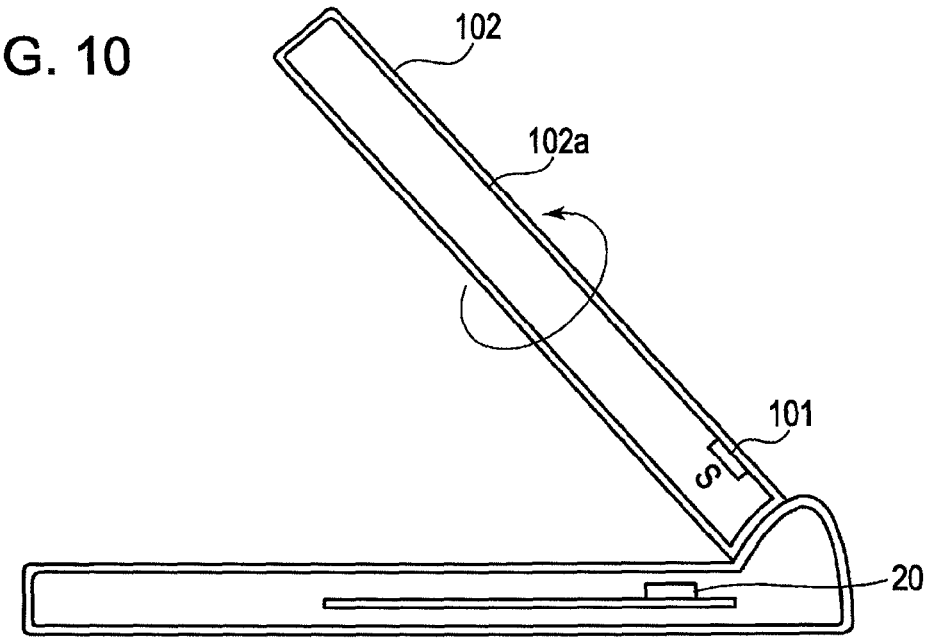
FIG. 10 is a fragmentary schematic side view of the folding cellular phone whose first member has been turned over.
Figure 11:
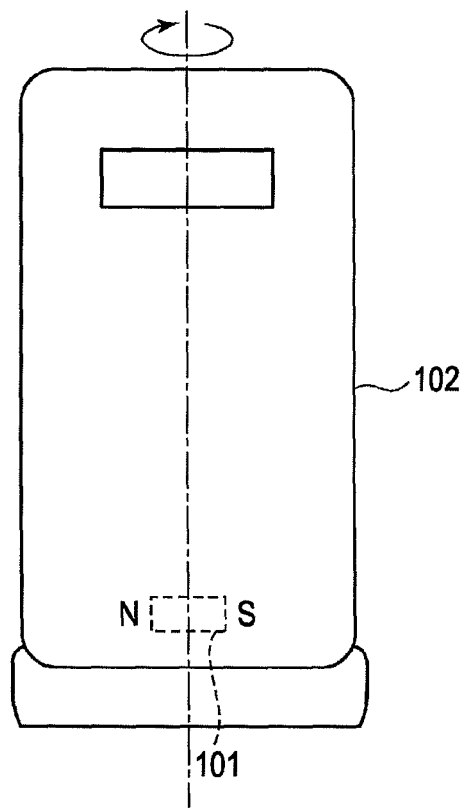
FIG. 11 is a fragmentary plan view of the folding cellular phone in the state shown in FIG. 9.
Figure 12:
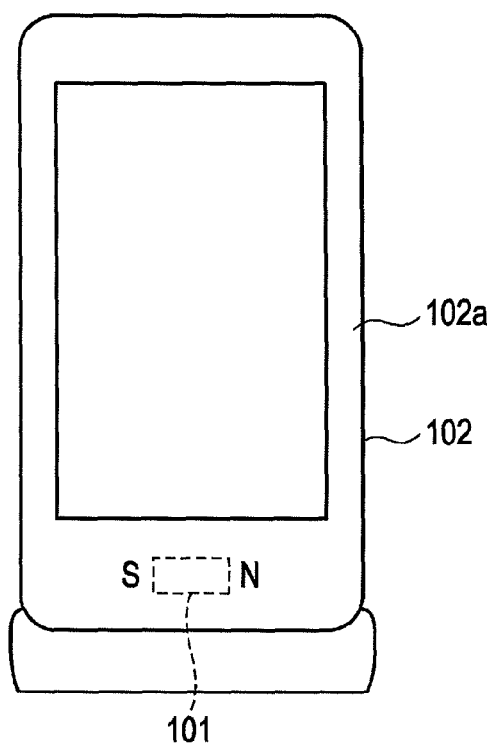
FIG. 12 is a fragmentary plan view of the folding cellular phone in the state shown in FIG. 10.

When a folding cellular phone 100 is opened as shown in FIG. 9, the intensity of the external magnetic field applied to the magnetic detecting device 20 is varied. That the cellular phone 100 has been opened is detected by the variation of the magnetic field intensity. The folding cellular phone 100 includes a first member 102 having a display screen and a second member 103 having a control face. When the cellular phone 100 is in the state shown in FIG. 9, the position of the magnet 101 is as shown in the plan view of FIG. 11. The first member 102 is turned 180° on the rotation axis so that the display screen 102a of the first member 102, which faces to the inside in the state shown in FIG. 9, faces to the outside as shown in FIGS. 10 and 12. At this point, the magnet 101 is turned over as shown in FIG. 12 from the state shown in FIG. 11. When, for example, the first member 102 is turned over to be used as a camera, the magnetic detecting device must detects whether the magnet 101 is turned over in addition to detecting whether it is opened or closed as shown in FIG. 9. In the magnetic detecting device 20 of the present embodiment, the circuit configurations shown in FIGS. 1 and 2, having two external output terminals 40 and 41 allow the detection whether the signal is of (+)-direction external magnetic field or of (−)-direction external magnetic field.

The magnetic detecting device 20 of the present embodiment can be used for detecting whether a portable electronic apparatus, such as electronic game, is opened or closed, as well as detecting whether the folding cellular phone is opened or closed. In addition to the open/close detection, the magnetic detecting device 20 can be applied to applications requiring bidirectional detection.

Figure 15:
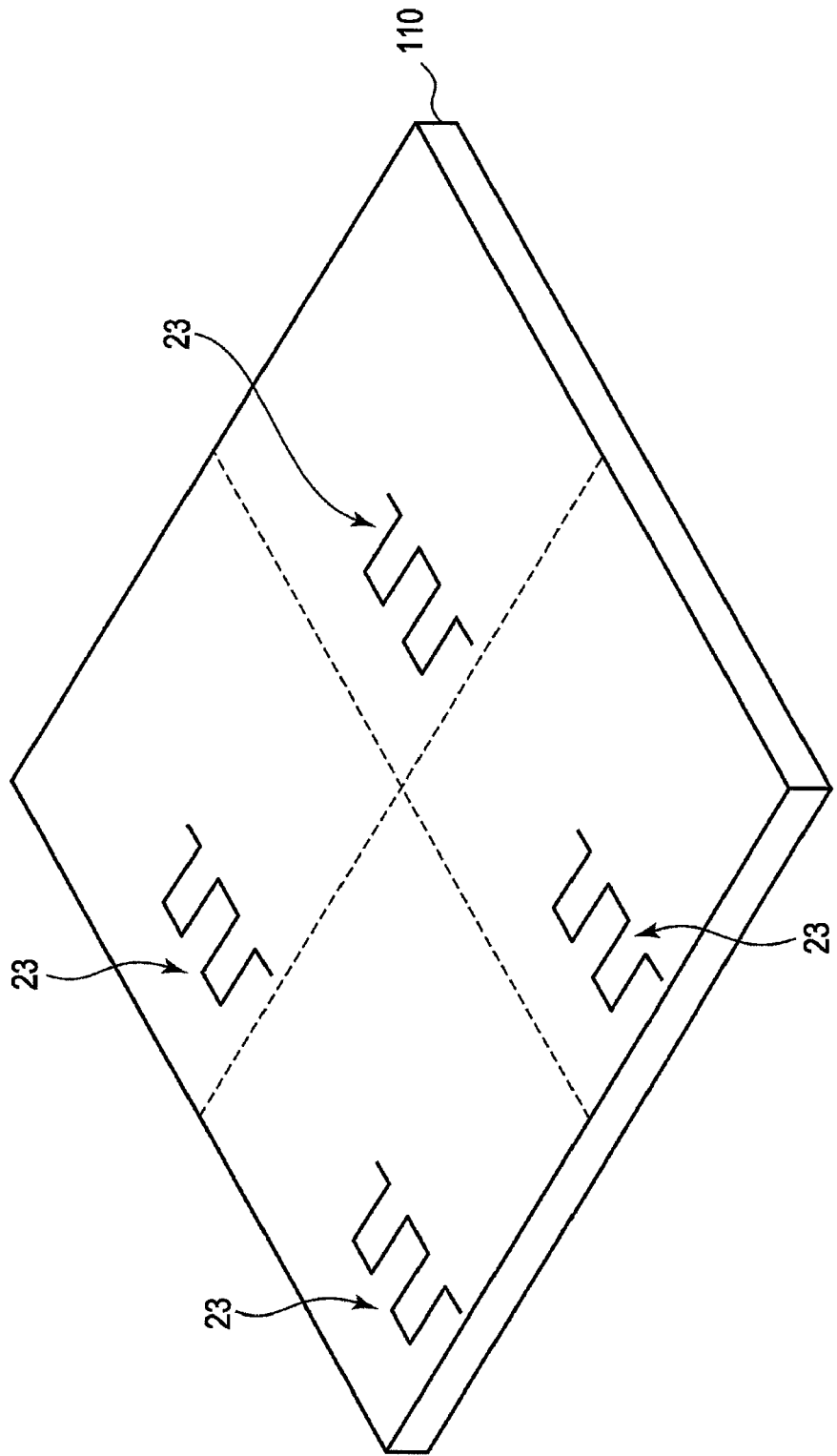
FIG. 15 is a representation of a step of a method for manufacturing the magnetic detecting device according to an embodiment of the invention.
Figure 16:
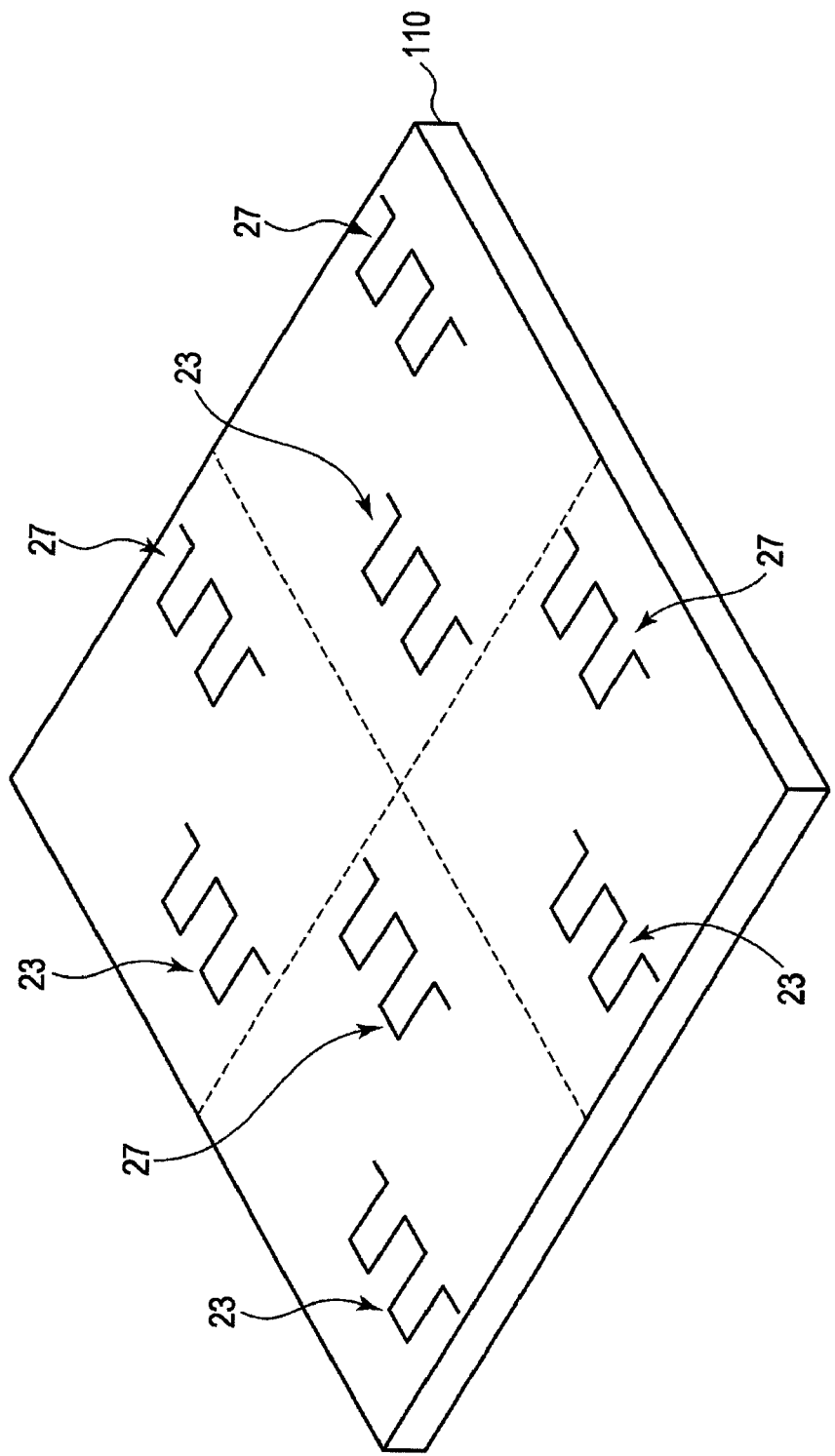
FIG. 16 is a representation of a step subsequent to the step shown in FIG. 15.
Figure 17:
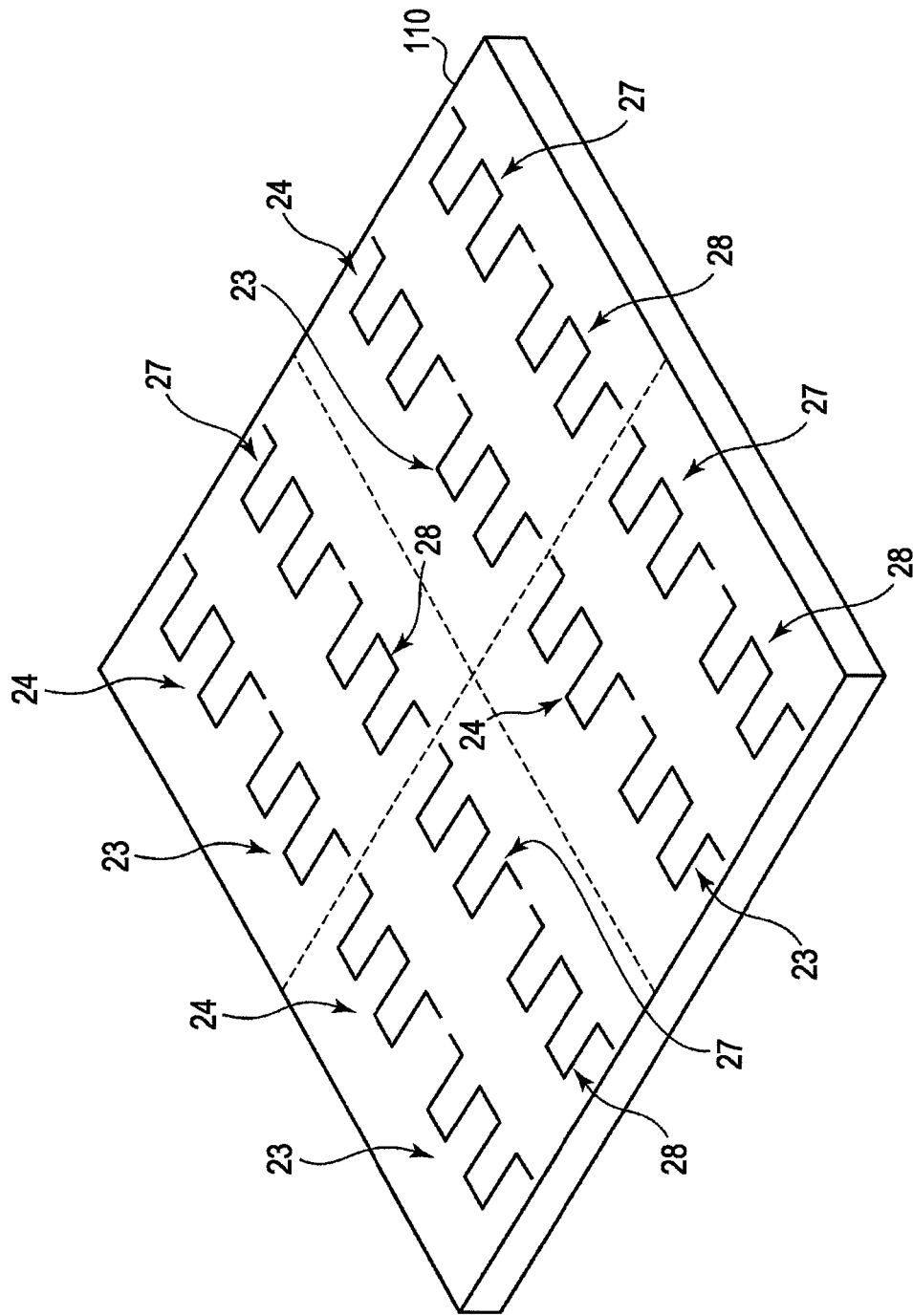
FIG. 17 is a representation of a step subsequent to the step shown in FIG. 16.

A method for manufacturing the magnetic detecting device 20 of the present embodiment will now be described. FIGS. 15 to 17 are fragmentary perspective views of the magnetic detecting device 20 in the course of a manufacturing process.

In a step shown in FIG. 15, a first magnetoresistive element 23 is formed for each section (divided by dotted lines in FIG.

15) on a substrate 110 larger than the above-mentioned substrate 70 by a thin-film forming process, such as photolithography or sputtering. The first magnetoresistive element 23 is formed in the layer structure shown in FIG. 7. Although FIG. 15 does not show the integrated circuit 22 or the insulating layer 78 shown in FIG. 6, the integrated circuit 22 and the insulating layer 78 are formed on the larger substrate 110 in practice, and the first magnetoresistive element 23 is formed on them.

Preferably, the nonmagnetic conductive layer 61 of the first magnetoresistive element 23 is formed of Cu to a thickness in the range of 24 to 26.5 Å.

Subsequently, a second magnetoresistive element 27 is formed for each section (divided by dotted lines in FIG. 16) on the large substrate 110 by a thin-film forming process, such as photolithography or sputtering, in a step shown in FIG. 16. The second magnetoresistive element 27 is formed in the layer structure shown in FIG. 7. More specifically, the second magnetoresistive element 27 is constituted of layers made of the same materials as the first magnetoresistive element 23, and all the layers except the nonmagnetic conductive layer 64, that is, the underlayer 60, the antiferromagnetic layer 62, the pinned magnetic layer 63, the free magnetic layer 65, and the protective layer 66 are formed to the same thicknesses as the corresponding layers of the first magnetoresistive element 23.

The nonmagnetic conductive layer 64 of the second magnetoresistive element 27 is formed to a thickness different from the nonmagnetic conductive layer 61 of the first magnetoresistive element 23. Preferably, the nonmagnetic conductive layer 64 of the second magnetoresistive element 27 is formed of Cu to a thickness in the range of 19.5 to 21 Å.

Subsequently, a first fixed resistor 24 and a second fixed resistor 28 are formed for each section (divided by dotted lines in FIG. 17) on the large substrate 110 by a thin-film forming process, such as photolithography or sputtering, in a step shown in FIG. 17. In the present embodiment, the first and second fixed resistors 24 and 28 are formed at one time in the same step. The layers of the first and second fixed resistors 24 and 28 are formed of the same materials as those of the first and second magnetoresistive elements 23 and 27, but unlike the first and second magnetoresistive elements 23 and 27, the magnetic layer 67 corresponding to the free magnetic layer 61 or 64 and the nonmagnetic conductive layer 68 are formed in an inverse order, as shown in FIG. 7. Consequently, the electric resistances of the first fixed resistor 24 and the second fixed resistor 28 are not affected by the external magnetic field. Since the layers of the first and second fixed resistors 24 and 28 are formed of the same materials as the first and second magnetoresistive elements 23 and 27, the same target can be used in the steps for forming the first magnetoresistive element 23, the second magnetoresistive element 27, and the first and second fixed resistors 24 and 28. Thus, the manufacturing process can be simplified and the manufacturing cost can be reduced.

In the present embodiment, the first and second fixed resistors 24 and 28 are formed in the same layer structure in the same process step. In this instance, the thickness of the first and second fixed resistors 24 and 28 are adjusted so that the TCR of the first and second fixed resistors 24 and 28 can be substantially the same as the TCRs of the first magnetoresistive element 23 and the second magnetoresistive element 27.

If the first and second fixed resistors 24 and 28 are formed in the same layer structure as the layer structure shown in FIG. 7, the underlayer 60, the antiferromagnetic layer 62, the pinned magnetic layer 63, the magnetic layer 67 corresponding to the free magnetic layer 65, and the protective layer 66 of the first and second fixed resistors 24 and 28 are formed to the same thicknesses as the respective layers of the first and second magnetoresistive elements 23 and 27. In addition, it is preferable that the nonmagnetic conductive layers 68 of the first and second fixed resistors 24 and 28 be formed of Cu to the same thickness as each other in the range of 19.5 to 26.5 Å, from the viewpoint of adjusting the TCR of the first and second fixed resistors 24 and 28 to substantially the same value as the TCRs of the first magnetoresistive element 23 and the second magnetoresistive element 27.

Then, the large substrate 110 is cut into a plurality of magnetic detecting devices 20 along the dotted lines.

In the present embodiment, the first fixed resistor 24 and the second fixed resistor 28 can be formed in the same step. Consequently, the manufacturing process of the magnetic detecting device 20 can be simplified.

Also, since each element is formed on the same substrate, the magnetic detecting device 20 can be miniaturized.

What is claimed is:

1. A magnetic detecting device for detecting bidirectional magnetic fields comprising:
    a first and a second magnetoresistive element using the magnetoresistive effect that changes the electric resistances thereof depending on an external magnetic field, the first and the second magnetoresistive element each including a pinned magnetic layer, a free magnetic layer, and a nonmagnetic conductive layer between the pinned magnetic layer and the free magnetic layer, thus acting as a giant magnetoresistive element whose electric resistance changes depending on the relationship between the magnetizations of the pinned magnetic layer and the free magnetic layer, the first and the second magnetoresistive element having the same layer structure as each other except that the nonmagnetic conductive layers have different thicknesses from each other, wherein a first interlayer coupling magnetic field acts between the free magnetic layer and the pinned magnetic layer of the first magnetoresistive element, a second interlayer coupling magnetic field acts between the free magnetic layer and the pinned magnetic layer of the second magnetoresistive element, and the thicknesses of the nonmagnetic conductive layers of the first and the second magnetoresistive element are set so that the first interlayer coupling magnetic field becomes positive and the second interlayer coupling magnetic field becomes negative;
    a first fixed resistor connected to the first magnetoresistive element in series and a second fixed resistor connected to the second magnetoresistive element in series, the first and the second fixed resistor having the same layer structure as each other, the first and the second fixed resistor having an electric resistance independent of the external magnetic field;
    wherein the first and second magnetoresistive elements each have the same direction in their magnetization directions of the pinned magnetic layers; and
    wherein the first and second magnetoresistive elements have opposite direction with each other in their magnetization directions of the free magnetic layers, under a condition of no external magnetic field.

2. The magnetic detecting device for detecting bidirectional magnetic fields according to claim 1, wherein the nonmagnetic conductive layers are made of Cu.

3. The magnetic detecting device for detecting bidirectional magnetic fields according to claim 2, wherein the nonmagnetic conductive layer of the first magnetoresistive element has a thickness in the range of 24 to 26.5 Å, and the nonmagnetic conductive layer of the second magnetoresistive element has a thickness in the range of 19.5 to 21 Å.

4. The magnetic detecting device for detecting bidirectional magnetic fields according to claim 1, wherein the first and the second fixed resistor each include layers made of the same materials as the layers of the first and the second magnetoresistive element, including a magnetic layer corresponding to the free magnetic layers of the first and the second magnetoresistive element and a nonmagnetic conductive layer, and the magnetic layer and the nonmagnetic conductive layer in the first and the second fixed resistor are disposed in an inverse order to the order of the free magnetic layer and the nonmagnetic conductive layer in the first and the second magnetoresistive element.

5. The magnetic detecting device for detecting bidirectional magnetic fields according to claim 4, wherein the layers of the first and the second fixed resistor except the nonmagnetic conductive layer each have the same thickness as the corresponding layer of the first and the second magnetoresistive element.

6. The magnetic detecting device for detecting bidirectional magnetic fields according to claim 4, wherein each nonmagnetic conductive layer is made of Cu, and the nonmagnetic conductive layer of the first magnetoresistive element has a thickness in the range of 24 to 26.5 Å, the nonmagnetic conductive layer of the second magnetoresistive element has a thickness in the range of 19.5 to 21 Å, and the nonmagnetic conductive layers of the first and the second fixed resistor have a thickness in the range of 19.5 to 26.5 Å.

7. A method for manufacturing a magnetic detecting device for detecting bidirectional magnetic fields including a first and a second magnetoresistive element using the magnetoresistive effect that changes the electric resistances thereof depending on an external magnetic field, and a first and a second fixed resistor connected in series to the first magnetoresistive element and the second magnetoresistive element, respectively, and having an electric resistance independent of the external magnetic field, the method comprising:

the step of forming the first magnetoresistive element including a pinned magnetic layer, a free magnetic layer, and a nonmagnetic conductive layer between the pinned magnetic layer and the free magnetic layer, thus acting as a giant magnetoresistive element whose electric resistance changes depending on the relationship between the magnetization of the pinned magnetic layer and the free magnetic layer, the nonmagnetic conductive layer being formed to a thickness that can produce a positive first interlayer coupling magnetic field between the free magnetic layer and the pinned magnetic layer;

the step of forming the second magnetoresistive element acting as a giant magnetoresistive element having the same layer structure as the first magnetoresistive element except that the nonmagnetic conductive layer is formed to a different thickness that can produce a negative second interlayer coupling magnetic field between the free magnetic layer and the pinned magnetic layer, wherein the first and second magnetoresistive elements each have the same direction in their magnetization directions of the pinned magnetic layers and wherein the first and second magnetoresistive elements have opposite direction with each other in their magnetization directions of the free magnetic layers, under a condition of no external magnetic field, the step of forming the second magnetoresistive element being performed different step from the step of forming the first magnetoresistive element; and the step of forming the first and the second fixed resistor together in the same layer structure.

8. The method according to claim 7, wherein the nonmagnetic conductive layers are formed of Cu.

9. The method according to claim 8, wherein the nonmagnetic conductive layer of the first magnetoresistive element is formed to a thickness in the range of 24 to 26.5 Å, and the nonmagnetic conductive layer of the second magnetoresistive element is formed to a thickness in the range of 19.5 to 21 Å.

10. The method according to claim 7, wherein the first and the second fixed resistor are formed so as to include layers formed of the same materials as the layers of the first and the second magnetoresistive element, including a magnetic layer corresponding to the free magnetic layers of the first and the second magnetoresistive element and a nonmagnetic conductive layer, and the magnetic layer and the nonmagnetic conductive layer in the first and the second fixed resistor are formed in an inverse order to the order of the free magnetic layer and the nonmagnetic conductive layer in the first and the second magnetoresistive element.

11. The method according to claim 10, wherein each nonmagnetic conductive layer is formed of Cu, and the nonmagnetic conductive layer of the first magnetoresistive element is formed to a thickness in the range of 24 to 26.5 Å, the nonmagnetic conductive layer of the second magnetoresistive element is formed to a thickness in the range of 19.5 to 21 Å, and the nonmagnetic conductive layers of the first and the second fixed resistor are formed to a thickness in the range of 19.5 to 26.5 Å.

* * * * *